(12) United States Patent
Degawa

(10) Patent No.: US 11,703,381 B2
(45) Date of Patent: Jul. 18, 2023

(54) LIGHT DETECTION ELEMENT, RECEIVING DEVICE, AND LIGHT SENSOR DEVICE

(71) Applicant: TDK CORPORATION, Tokyo (JP)

(72) Inventor: Naomichi Degawa, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 17/584,859

(22) Filed: Jan. 26, 2022

(65) Prior Publication Data

US 2022/0252449 A1 Aug. 11, 2022

(30) Foreign Application Priority Data

Feb. 8, 2021 (JP) .................................. 2021-018156
Oct. 28, 2021 (JP) .................................. 2021-176495

(51) Int. Cl.
*G01J 1/42* (2006.01)
*G01J 1/04* (2006.01)

(52) U.S. Cl.
CPC ............... *G01J 1/42* (2013.01); *G01J 1/0488* (2013.01)

(58) Field of Classification Search
CPC .......... H01L 27/14621; H01L 27/222; H01L 27/11621; H01L 43/10; H01L 43/08; H01L 43/02; H04B 10/11; H04B 10/1143; H04B 10/1149; H04B 10/114; H04B 10/116; G01J 2001/4446; G01J 2001/4295; G01J 1/04; G01J 1/0488; G01J 1/42
See application file for complete search history.

(56) References Cited

U.S. PATENT DOCUMENTS

| | | | |
|---|---|---|---|
| 6,925,261 B2 | 8/2005 | Haruyama | |
| 9,279,925 B2* | 3/2016 | Shinto | G01J 3/51 |
| 9,423,301 B2* | 8/2016 | Savoy | G01J 5/20 |
| 9,842,874 B2 | 12/2017 | Nakata | |
| 2001/0040713 A1 | 11/2001 | Haruyama | |
| 2015/0333839 A1* | 11/2015 | Li | H04B 10/532 |
| | | | 398/152 |
| 2021/0404867 A1* | 12/2021 | Jaiswal | H01L 43/04 |
| 2022/0131020 A1* | 4/2022 | Mizuno | G02B 6/124 |
| 2022/0178741 A1* | 6/2022 | Fukuzawa | H04B 10/40 |
| 2022/0208820 A1* | 6/2022 | Fukuzawa | H01L 27/14621 |
| 2022/0231181 A1* | 7/2022 | Yamane | H01L 43/08 |
| 2022/0252449 A1* | 8/2022 | Degawa | G01J 1/0488 |
| 2022/0260425 A1* | 8/2022 | Jacob | G01J 5/22 |
| 2022/0317397 A1* | 10/2022 | Shibata | G02B 6/43 |
| 2022/0317484 A1* | 10/2022 | Shibata | H01S 5/0085 |

FOREIGN PATENT DOCUMENTS

JP 2001-292107 A 10/2001

OTHER PUBLICATIONS

Chen et al., "All-Optical Switching of Magnetic Tunnel Junctions with Single Subpicosecond Laser Pulses", Physical Review Applied, 2017, vol. 7, pp. 021001-1-021001-6.

* cited by examiner

*Primary Examiner* — John R Lee
(74) *Attorney, Agent, or Firm* — Oliff PLC

(57) ABSTRACT

Provided are a light detection element, a receiving device, and a light sensor device. The light detection element includes a magnetic element that includes a first ferromagnetic layer, a second ferromagnetic layer, and a spacer layer interposed between the first ferromagnetic layer and the second ferromagnetic layer, wherein the first ferromagnetic layer is irradiated with light in a direction intersecting a stacking direction of the magnetic element.

14 Claims, 12 Drawing Sheets

LIGHT DETECTION ELEMENT, RECEIVING DEVICE, AND LIGHT SENSOR DEVICE

BACKGROUND

The present disclosure relates to a light detection element, a receiving device, and a light sensor device.

Priority is claimed on Japanese Patent Application No. 2021-018156, filed on Feb. 8, 2021, and Japanese Patent Application No. 2021-176495, filed on Oct. 28, 2021, the contents of which are incorporated herein by reference.

Photoelectric conversion elements are used in various applications.

For example, Patent Document 1 describes a receiving device that receives a light signal using a photodiode. A photodiode is, for example, a pn junction diode using a pn junction of a semiconductor and converts light into an electrical signal.

Further, for example, Patent Document 2 describes a light sensor using a pn junction of a semiconductor and an image sensor using this light sensor.

PATENT DOCUMENTS

[Patent Document 1] Japanese Unexamined Patent Application, First Publication No. 2001-292107
[Patent Document 2] U.S. Pat. No. 9,842,874

SUMMARY

A light detection element using a pn junction of a semiconductor is widely used, but a new light detection element is required for further development. Further, a light detection element converts light into an electrical signal, and improvement in conversion accuracy is required of the light detection element.

It is desirable to provide a light detection element, a receiving device, and a light sensor device having good responsiveness to light.

The following means are provided.

A light detection element according to a first aspect includes: a magnetic element that includes a first ferromagnetic layer, a second ferromagnetic layer, and a spacer layer interposed between the first ferromagnetic layer and the second ferromagnetic layer, wherein the first ferromagnetic layer is irradiated with light in a direction intersecting a stacking direction of the magnetic element.

A receiving device according to a second aspect includes the light detection element according to the above aspect.

A light sensor device according to a third aspect includes the light detection element according to the above aspect.

DETAILED DESCRIPTION

Figure 1:
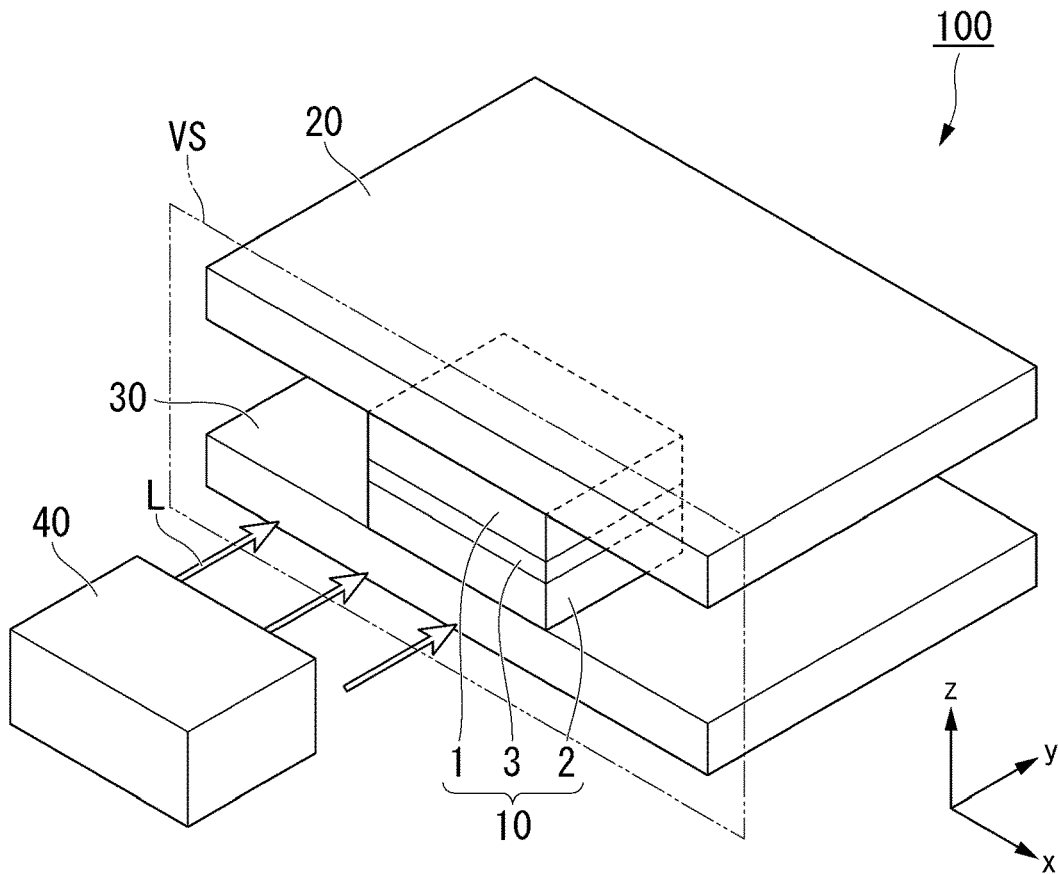
FIG. 1 is a perspective view of a light detection element according to a first embodiment.

Hereinafter, embodiments will be described in detail with reference to the drawings as appropriate. In the drawings which will be used in the following description, featured portions may be enlarged for convenience in order to make the features easy to understand, and the dimensional ratio of each component may be different from the actual one. The materials, dimensions, and the like which will be exemplified in the following description are examples, and the present disclosure is not limited thereto and can be appropriately modified and carried out within a range in which the effects of the present disclosure are exhibited.

Directions are defined as follow. A stacking direction of a magnetic element 10 is a z direction, one direction on a plane orthogonal to the z direction is an x direction, and a direction orthogonal to the x direction and the z direction is a y direction. The z direction is an example of the stacking direction. Hereinafter, a +z direction may be expressed as "above," and a −z direction may be expressed as "below." The +z direction is a direction from a second ferromagnetic layer 2 to a first ferromagnetic layer 1. Above and below do not always match the direction in which gravity is applied.

The light detection element, the receiving device, and the light sensor device according to the above aspects have good responsiveness to light.

First Embodiment

Figure 2:
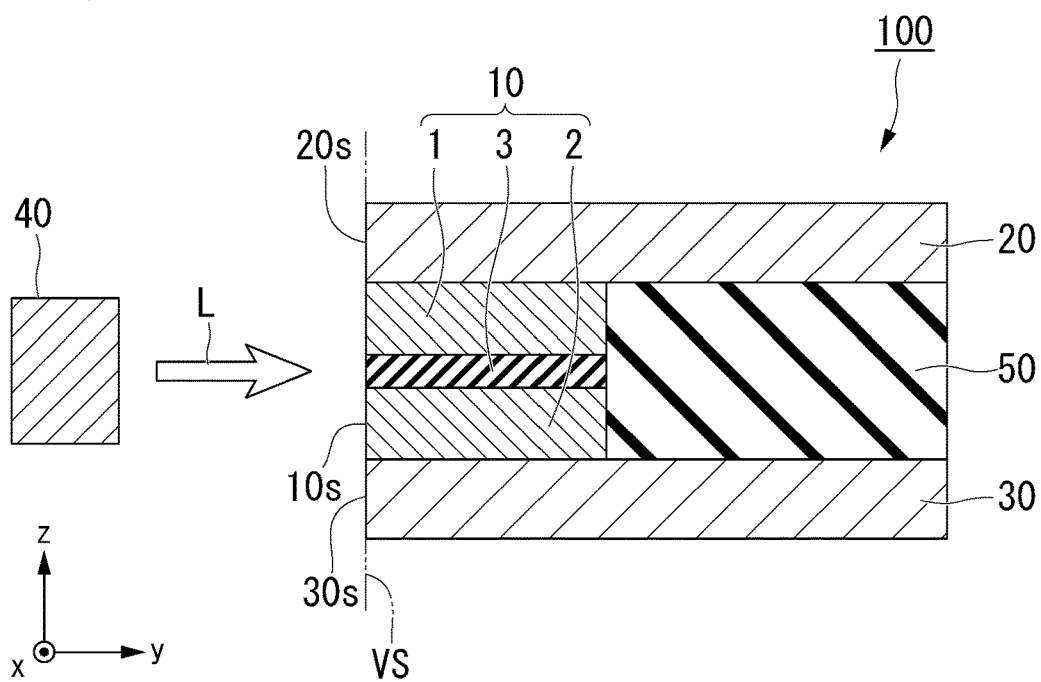
FIG. 2 is a cross-sectional view of the light detection element according to the first embodiment.
Figure 3:
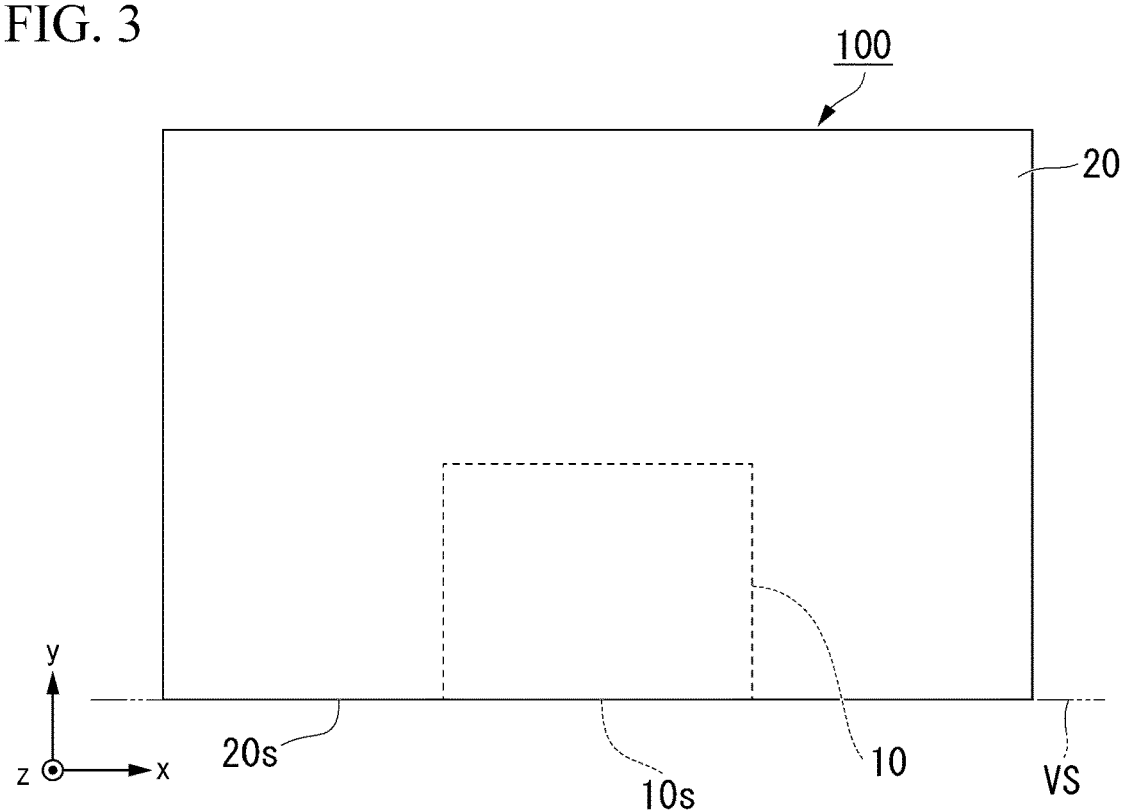
FIG. 3 is a plan view of the light detection element according to the first embodiment.

FIG. 1 is a perspective view of a light detection element 100 according to a first embodiment. FIG. 2 is a yz cross-sectional view of the light detection element 100 according to the first embodiment. FIG. 3 is a plan view of the light detection element 100 according to the first embodiment in the z direction.

The light detection element 100 converts a state of applied light L or a change in the state of the applied light L into an electrical signal. The light L in the present specification is not limited to visible light and also includes infrared light having a wavelength longer than that of visible light and ultraviolet light having a wavelength shorter than that of visible light. The wavelength of visible light is, for example, 380 nm or more and less than 800 nm. The wavelength of infrared light is, for example, 800 nm or more and 1 mm or less. The wavelength of ultraviolet light is, for example, 200 nm or more and less than 380 nm.

The light detection element 100 has, for example, a magnetic element 10, a first electrode 20, a second electrode 30, a light irradiation part 40, and an insulating layer 50.

The light irradiation part 40 is, for example, a portion where the light L propagated from a light source is emitted. The light L emitted from the light irradiation part 40 is applied to a side surface 10s of the magnetic element 10. The light irradiation part 40 faces, for example, the side surface 10s of the magnetic element 10.

The light L is applied to the magnetic element 10 in a direction intersecting the z direction. The light L is applied to the side surface 10s of the magnetic element 10 in the y direction, for example. Hereinafter, the direction in which light is mainly applied to the magnetic element 10 is referred to as a light irradiation direction. The term "mainly applied" means that the intensity of the light applied in this direction is larger than the intensity of the light applied in any other direction. In FIGS. 1 and 2, the y direction is the light irradiation direction with respect to the magnetic element 10. The light L is, for example, light that includes a high-frequency light signal and changes in intensity or light that passes through a wavelength filter and whose wavelength range is controlled. The high-frequency light signal is, for example, a signal having a frequency of 100 MHz or more.

The first electrode 20 is in contact with a first surface of the magnetic element 10. The first surface is a surface of the magnetic element 10 on a side of the first ferromagnetic layer 1 in the z direction. The second electrode 30 is in contact with a second surface of the magnetic element 10. The second surface is a surface of the magnetic element 10 on a side of the second ferromagnetic layer 2 in the z direction. For example, the magnetic element 10 is interposed between the first electrode 20 and the second electrode 30 in the z direction.

The first electrode 20 and the second electrode 30 are made of a conductive material. The first electrode 20 and the second electrode 30 are made of, for example, a metal such as Cu, Al, Au, or Ru. Ta or Ti may be stacked above and below the metal. Further, a stacked film of Cu and Ta, a stacked film of Ta, Cu and Ti, and a stacked film of Ta, Cu and TaN may be used as the first electrode 20 and the second electrode 30. Further, TiN or TaN may be used as the first electrode 20 and the second electrode 30.

The first electrode 20 and the second electrode 30 may have transparency in a wavelength range of the light applied to the magnetic element 10. For example, the first electrode 20 and the second electrode 30 may be transparent electrodes that contain a transparent electrode material of an oxide such as indium tin oxide (ITO), indium zinc oxide (IZO), zinc oxide (ZnO), or indium gallium zinc oxide (IGZO). Further, the first electrode 20 and the second electrode 30 may be configured to have a plurality of columnar metals in the transparent electrode material.

The insulating layer 50 is located between the first electrode 20 and the second electrode 30. The insulating layer 50 covers, for example, a portion of the magnetic element 10 other than the side surface 10s irradiated with the light L. The insulating layer 50 is an interlayer insulating film. The insulating layer 50 is, for example, an oxide, a nitride, or an oxynitride of Si, Al, or Mg. The insulating layer 50 is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

When a state of the applied light L changes, a resistance value of the magnetic element 10 in the z direction changes according to the change in the state of the light L. When the state of the light L applied to the magnetic element 10 changes, an output voltage from the magnetic element 10 changes according to the change in the state of the light L. The magnetic element 10 has, for example, the first ferromagnetic layer 1, the second ferromagnetic layer 2, and a spacer layer 3. The spacer layer 3 is located between the first ferromagnetic layer 1 and the second ferromagnetic layer 2. The magnetic element 10 may have another layer in addition to these.

A part of a side surface of the magnetic element 10 is irradiated with light. For example, the side surface 10s is irradiated with light. The side surface 10s is a side surface among the side surfaces of the magnetic element 10 on a side on which the light L is mainly applied. The intensity of the light applied to the side surface 10s is higher than the intensity of the light applied to the other side surface. The side surface 10s is, for example, a light receiving surface of the light L.

A part of the side surface of the magnetic element 10 is a flat surface. For example, the side surface 10s is a flat surface. For example, the side surface 10s which is a flat surface is irradiated with the light L.

The side surface of the magnetic element 10 and side surface of at least one of the first electrode 20 and the second electrode 30 are in contact with the same virtual plane VS at least in part. The virtual plane VS is one of tangent planes with respect to the side surface of the magnetic element 10. The light L is applied to the first ferromagnetic layer 1 from a side of the virtual plane VS.

For example, the side surface 10s, the side surface 20s of the first electrode 20, and the side surface 30s of the second electrode 30 are in contact with the same virtual plane VS. The side surface 10s, the side surface 20s, and the side surface 30s are continuous. The side surface 20s is a side surface among the side surfaces of the first electrode 20 on a side on which the light L is mainly applied. The side surface 30s is a side surface among the side surfaces of the second electrode 30 on a side on which the light L is mainly applied.

The magnetic element 10 is, for example, a magnetic tunnel junction (MTJ) element in which the spacer layer 3 is made of an insulating material. In this case, a resistance value of the magnetic element 10 in the z direction (a resistance value in a case in which a current flows in the z direction) changes according to a relative change between a magnetization state of the first ferromagnetic layer 1 and a magnetization state of the second ferromagnetic layer 2. Such an element is also called a magnetoresistance effect element.

The first ferromagnetic layer 1 is a light detection layer whose magnetization state changes when light is applied from the outside. The first ferromagnetic layer 1 is also called a magnetization free layer. The magnetization free layer is a layer containing a magnetic substance whose magnetization state changes when a predetermined external force is applied. The predetermined external force is, for example, light L applied from the outside, a current flowing in the z direction of the magnetic element 10, or an external magnetic field. The magnetization state of the first ferromagnetic layer 1 changes according the intensity of the light L applied to the first ferromagnetic layer 1.

The first ferromagnetic layer 1 contains a ferromagnetic substance. The first ferromagnetic layer 1 contains at least one magnetic element such as Co, Fe, or Ni. The first ferromagnetic layer 1 may contain a non-magnetic element such as B, Mg, Hf, or Gd in addition to the magnetic element as described above. The first ferromagnetic layer 1 may be, for example, an alloy containing a magnetic element and a non-magnetic element. The first ferromagnetic layer 1 may be constituted by a plurality of layers. The first ferromagnetic layer 1 is, for example, a CoFeB alloy, a stacked body in which a CoFeB alloy layer is interposed between Fe layers, or a stacked body in which a CoFeB alloy layer is interposed between CoFe layers.

The first ferromagnetic layer 1 may be an in-plane magnetization film having a magnetization-facilitating axis in an in-plane direction of the film (any direction in an xy plane), or a vertical magnetization film having a magnetization-facilitating axis in a direction perpendicular to a plane of the film (z direction).

A film thickness of the first ferromagnetic layer 1 is 1 nm or more and 5 nm or less, for example. The film thickness of the first ferromagnetic layer 1 may be 1 nm or more and 2 nm or less, for example. In a case in which the first ferromagnetic layer 1 is a vertical magnetization film, when the film thickness of the first ferromagnetic layer 1 is thinner, an effect of applying vertical magnetic anisotropy from the layers above and below the first ferromagnetic layer 1 is strengthened, and the vertical magnetic anisotropy of the ferromagnetic layer 1 increases. That is, when the vertical magnetic anisotropy of the first ferromagnetic layer 1 is high, a force for magnetization M1 to return in the z direction is strengthened. On the other hand, when the film thickness of the first ferromagnetic layer 1 is thicker, the effect of applying the vertical magnetic anisotropy from the layers above and below the first ferromagnetic layer 1 is relatively weakened, and the vertical magnetic anisotropy of the ferromagnetic layer 1 decreases.

When the film thickness of the first ferromagnetic layer 1 becomes thinner, the volume of the ferromagnetic substance becomes smaller, and when the film thickness becomes thicker, the volume of the ferromagnetic substance becomes larger. The susceptibility of the magnetization of the first ferromagnetic layer 1 when energy is applied from the outside is inversely proportional to a product (KuV) of the magnetic anisotropy (Ku) and the volume (V) of the first ferromagnetic layer 1. That is, when the product of the magnetic anisotropy and the volume of the first ferromagnetic layer 1 becomes smaller, the susceptibility to light increases. From this point of view, in order to enhance the susceptibility to light, the volume of the first ferromagnetic layer 1 may be reduced while the magnetic anisotropy of the first ferromagnetic layer 1 is appropriately configured.

When the film thickness of the first ferromagnetic layer 1 is thicker than 2 nm, an insertion layer made of, for example, Mo and W may be provided in the first ferromagnetic layer 1. That is, the first ferromagnetic layer 1 may be a stacked body in which a ferromagnetic layer, an insertion layer, and a ferromagnetic layer are stacked in that order in the z direction. The vertical magnetic anisotropy of the entire first ferromagnetic layer 1 increases due to interfacial magnetic anisotropy at an interface between the insertion layer and the ferromagnetic layer. A film thickness of the insertion layer is, for example, 0.1 nm to 0.6 nm.

The second ferromagnetic layer 2 is a magnetization fixed layer. The magnetization fixed layer is a layer made of a magnetic substance whose magnetization state is less likely to change than that of the magnetization free layer when predetermined energy is applied from the outside. For example, in the magnetization fixed layer, a direction of the magnetization is less likely to change than that of the magnetization free layer when predetermined energy is applied from the outside. Further, for example, in the magnetization fixed layer, the magnitude of the magnetization is less likely to change than that of the magnetization free layer when predetermined energy is applied from the outside. A coercive force of the second ferromagnetic layer 2 is, for example, larger than a coercive force of the first ferromagnetic layer 1. The second ferromagnetic layer 2 has, for example, a magnetization-facilitating axis in the same direction as the first ferromagnetic layer 1. The second ferromagnetic layer 2 may be an in-plane magnetization film or a vertical magnetization film.

A material constituting the second ferromagnetic layer 2 is, for example, the same as that of the first ferromagnetic layer 1. The second ferromagnetic layer 2 may be, for example, a stacked body in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are stacked in order.

The magnetization of the second ferromagnetic layer 2 may be fixed by magnetic coupling with a third ferromagnetic layer via a magnetic coupling layer, for example. In this case, a combination of the second ferromagnetic layer 2, the magnetic coupling layer, and the third ferromagnetic layer may be referred to as the magnetization fixed layer.

The third ferromagnetic layer is magnetically coupled with the second ferromagnetic layer 2, for example. The magnetic coupling is, for example, antiferromagnetic coupling and is caused by a RKKY interaction. A material constituting the third ferromagnetic layer is, for example, the same as that of the first ferromagnetic layer 1. The magnetic coupling layer is, for example, Ru, Ir, or the like.

The spacer layer 3 is a non-magnetic layer disposed between the first ferromagnetic layer 1 and the second ferromagnetic layer 2. The spacer layer 3 is constituted by a layer made of a conductor, an insulator, or a semiconductor or a layer including an energizing point made of a conductor in an insulator. A film thickness of the spacer layer 3 can be adjusted according to an orientation direction of the magnetization of the first ferromagnetic layer 1 and the magnetization of the second ferromagnetic layer 2 in an initial state which will be described later.

For example, in a case in which the spacer layer 3 is made of an insulator, the magnetic element 10 has a magnetic tunnel junction (MTJ) formed by the first ferromagnetic layer 1, the spacer layer 3, and the second ferromagnetic layer 2. Such an element is called an MTJ element. In this case, the magnetic element 10 can exhibit a tunnel magnetoresistance (TMR) effect. In a case in which the spacer layer 3 is made of a metal, the magnetic element 10 can exhibit a giant magnetoresistance (GMR) effect. Such an element is called a GMR element. The magnetic element 10 may be called the MTJ element, the GMR element, or the like depending on the constituent material of the spacer layer 3, but is also collectively called the magnetoresistance effect element.

In a case in which the spacer layer 3 is made of an insulating material, a material containing aluminum oxide, magnesium oxide, titanium oxide, silicon oxide, or the like can be used. Further, the insulating material may contain an element such as Al, B, Si, or Mg, or a magnetic element such as Co, Fe, or Ni. A high rate of change in magnetoresistance can be obtained by adjusting the film thickness of the spacer layer 3 such that a high TMR effect is exhibited between the first ferromagnetic layer 1 and the second ferromagnetic layer 2. In order to efficiently utilize the TMR effect, the film thickness of the spacer layer 3 may be about 0.5 to 5.0 nm or about 1.0 to 2.5 nm.

In a case in which the spacer layer 3 is made of a non-magnetic conductive material, a conductive material such as Cu, Ag, Au or Ru can be used. In order to efficiently utilize the GMR effect, the film thickness of the spacer layer 3 may be about 0.5 to 5.0 nm or about 2.0 to 3.0 nm.

In a case in which the spacer layer 3 is made of a non-magnetic semiconductor material, a material such as zinc oxide, indium oxide, tin oxide, germanium oxide, gallium oxide, or ITO can be used. In this case, the film thickness of the spacer layer 3 may be about 1.0 to 4.0 nm.

In a case in which a layer including an energizing point made of a conductor in a non-magnetic insulator is applied as the spacer layer 3, a structure including an energizing point made of a non-magnetic conductor such as Cu, Au, or Al in a non-magnetic insulator made of aluminum oxide or magnesium oxide may be used. Further, the conductor may be made of a magnetic element such as Co, Fe, or Ni. In this case, the film thickness of the spacer layer 3 may be about 1.0 to 2.5 nm. The energizing point is, for example, a columnar body having a diameter of 1 nm or more and 5 nm or less when seen in a direction perpendicular to a plane of the film.

In addition, the magnetic element 10 may have a base layer, a cap layer, a vertical magnetization induction layer, and the like. The base layer is located between the second ferromagnetic layer 2 and the second electrode 30. The base layer is a seed layer or a buffer layer. The seed layer enhances the crystallinity of a layer stacked on the seed layer. The seed layer is, for example, Pt, Ru, Hf, Zr, or NiFeCr. A film thickness of the seed layer is, for example, 1 nm or more and 5 nm or less. The buffer layer is a layer that alleviates lattice mismatch between different crystals. The buffer layer is, for example, Ta, Ti, W, Zr, Hf, or a nitride of these elements. A film thickness of the buffer layer is, for example, 1 nm or more and 5 nm or less.

The cap layer is located between the first ferromagnetic layer 1 and the first electrode 20. The cap layer prevents damage to a lower layer during a process and enhances the crystallinity of the lower layer during annealing. A film thickness of the cap layer is, for example, 3 nm or less such that the first ferromagnetic layer 1 is irradiated with sufficient light. The cap layer is, for example, MgO, W, Mo, Ru, Ta, Cu, Cr, or a stacked film thereof.

The vertical magnetization induction layer is formed in a case in which the first ferromagnetic layer 1 is a vertical magnetization film. The vertical magnetization induction layer is stacked on the first ferromagnetic layer 1. The vertical magnetization induction layer induces the vertical magnetic anisotropy of the first ferromagnetic layer 1. The vertical magnetization induction layer is, for example, magnesium oxide, W, Ta, Mo, or the like. In a case in which the vertical magnetization induction layer is magnesium oxide, magnesium oxide may be oxygen-deficient in order to increase conductivity. A film thickness of the vertical magnetization induction layer is, for example, 0.5 nm or more and 2.0 nm or less.

The light detection element 100 is manufactured through a stacking step, an annealing step, and a processing step of each layer. First, the second electrode 30, the second ferromagnetic layer 2, the spacer layer 3, and the first ferromagnetic layer 1 are stacked on a substrate in order. Each layer is formed by, for example, sputtering.

Then, the stacked film is annealed. An annealing temperature is, for example, 250° C. to 450° C. In a case in which the substrate is a circuit board, annealing may be performed at 400° C. or higher. After that, the stacked film is processed into a predetermined columnar body by photolithography and etching. The columnar body may be a circular column or a prismatic column. For example, the shortest width when the columnar body is seen in the z direction may be 10 nm or more and 2000 nm or less, or 30 nm or more and 500 nm or less.

Next, the insulating layer 50 is formed to cover a side surface of the columnar body. The insulating layer 50 may be stacked a plurality of times. Next, an upper surface of the first ferromagnetic layer 1 is exposed from the insulating layer 50 by chemical mechanical polishing (CMP), and the first electrode 20 is manufactured on the first ferromagnetic layer 1.

Next, the substrate and the insulating layer 50 are cut. Then, a cut surface is subjected to, for example, chemical mechanical polishing (CMP) and ion beam etching, and the insulating layer 50 is removed. Therefore, the second electrode 30, the second ferromagnetic layer 2, the spacer layer 3, and the first ferromagnetic layer 1 are exposed from the insulating layer 50. As a result, the side surface 10s becomes a flat surface, and the side surface 30s, the side surface 10s, and the side surface 20s are continuous. Finally, the light detection element 100 is obtained by disposing the light irradiation part 40 at a position facing the side surface 10s.

Next, some examples of an operation of the light detection element 100 will be described. The first ferromagnetic layer 1 is irradiated with light whose light intensity changes. The output voltage from the light detection element 100 changes as the light is applied to the first ferromagnetic layer 1. In a first operation example, a case in which the intensity of the light applied to the first ferromagnetic layer 1 has two stages of a first intensity and a second intensity will be described as an example. The intensity of the light having the second intensity is larger than the intensity of the light having the first intensity. The first intensity may be a case in which the intensity of the light applied to the first ferromagnetic layer 1 is zero.

Figure 4:
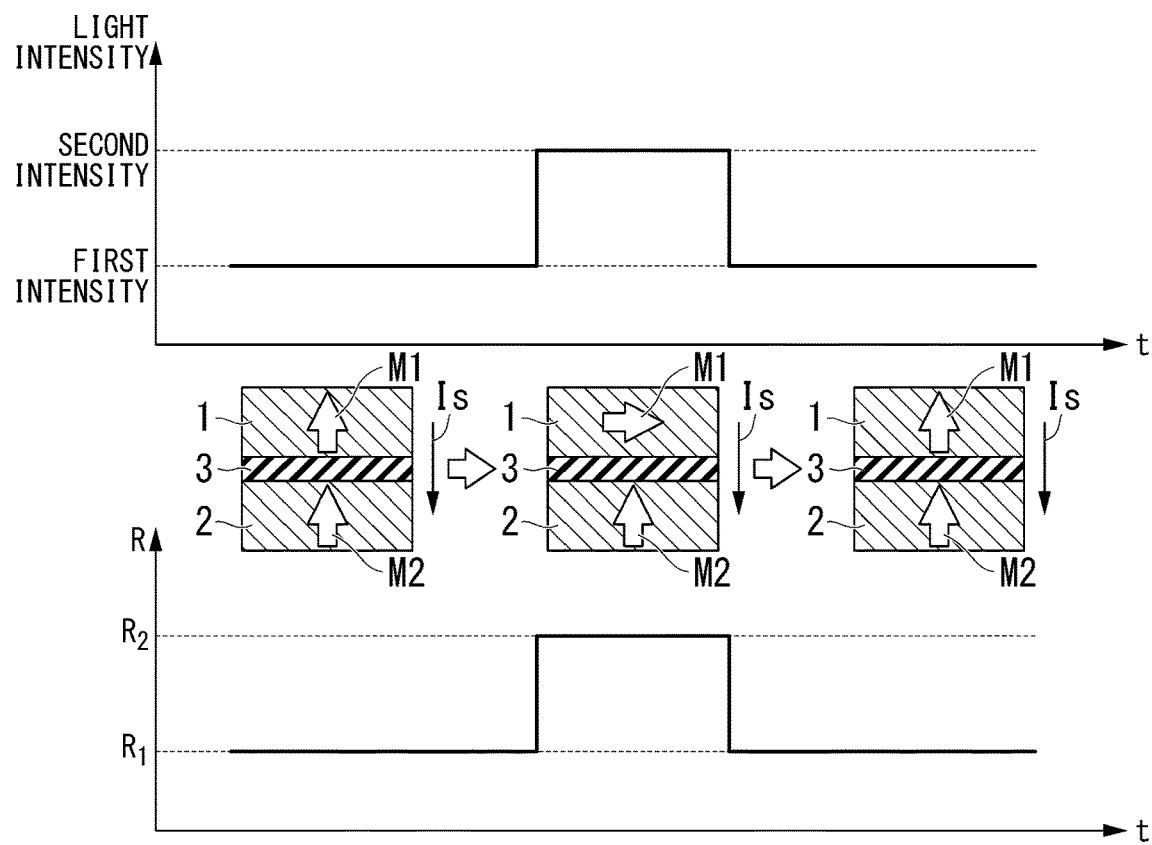
FIG. 4 is a diagram for explaining a first mechanism of a first operation example of the light detection element according to the first embodiment.
Figure 5:
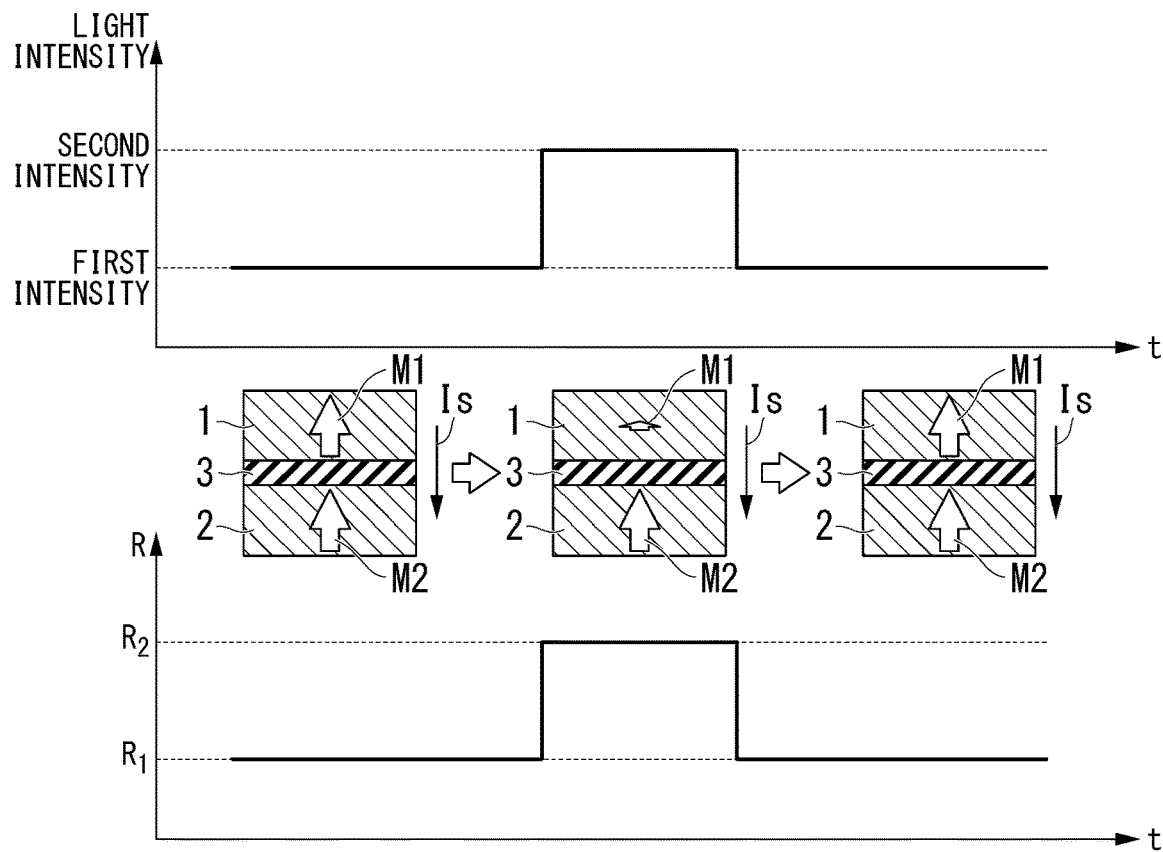
FIG. 5 is a diagram for explaining a second mechanism of the first operation example of the light detection element according to the first embodiment.

FIGS. 4 and 5 are diagrams for explaining the first operation example of the light detection element 100 according to the first embodiment. FIG. 4 is a diagram for explaining a first mechanism of the first operation example, and FIG. 5 is a diagram for explaining a second mechanism of the first operation example. In upper graphs of FIGS. 4 and 5, a vertical axis represents the intensity of the light applied to the first ferromagnetic layer 1, and a horizontal axis represents time. In lower graphs in FIGS. 4 and 5, a vertical axis represents a resistance value of the magnetic element 10 in the z direction, and a horizontal axis represents time.

First, in a state in which the first ferromagnetic layer 1 is irradiated with the light having the first intensity (hereinafter referred to as an initial state), the magnetization M1 of the first ferromagnetic layer 1 and the magnetization M2 of the second ferromagnetic layer 2 are parallel to each other, the resistance value of the magnetic element 10 in the z direction indicates a first resistance value R1, and the magnitude of the output voltage from the magnetic element 10 indicates a first value. A voltage is generated across both ends of the magnetic element 10 in the z direction by allowing a sense current Is to flow in the z direction of the magnetic element 10, and the resistance value of the magnetic element 10 in the z direction is obtained from a value of the voltage using Ohm's law. The output voltage from the magnetic element 10 is generated between the first electrode 20 and the second electrode 30. In a case of the example shown in FIG. 4, the sense current Is is allowed to flow from the first ferromagnetic layer 1 toward the second ferromagnetic layer 2. By allowing the sense current Is to flow in this direction, a spin transfer torque in the same direction as the magnetization M2 of the second ferromagnetic layer 2 acts on the magnetization M1 of the first ferromagnetic layer 1, and the magnetization M1 and the magnetization M2 become parallel to each other in the initial state. Further, by allowing the sense current Is to flow in this direction, it is possible to prevent the magnetization M1 of the first ferromagnetic layer 1 from being inverted during the operation.

Next, the intensity of the light applied to the first ferromagnetic layer 1 changes from the first intensity to the second intensity. The second intensity is larger than the first intensity, and the magnetization M1 of the first ferromagnetic layer 1 changes from the initial state. The state of the magnetization M1 of the first ferromagnetic layer 1 in the state in which the first ferromagnetic layer 1 is not irradiated with light is different from the state of the magnetization M1 of the first ferromagnetic layer 1 in the second intensity. The state of the magnetization M1 is, for example, a tilt angle with respect to the z direction, a magnitude, or the like.

For example, as shown in FIG. 4, when the intensity of the light applied to the first ferromagnetic layer 1 changes from the first intensity to the second intensity, the magnetization M1 is tilted with respect to the z direction. Further, for example, as shown in FIG. 5, when the intensity of the light applied to the first ferromagnetic layer 1 changes from the first intensity to the second intensity, the magnitude of the magnetization M1 becomes smaller. For example, in a case in which the magnetization M1 of the first ferromagnetic layer 1 is tilted with respect to the z direction due to the irradiation intensity of the light, the tilt angle is larger than 0° and smaller than 90°.

When the magnetization M1 of the first ferromagnetic layer 1 changes from the initial state, the resistance value of the magnetic element 10 in the z direction indicates a second resistance value R2, and the magnitude of the output voltage from the magnetic element 10 indicates a second value. The second resistance value R2 is larger than the first resistance value R1, and the second value of the output voltage is larger than the first value. The second resistance value R2 is a value between the resistance value in a case in which the magnetization M1 and the magnetization M2 are parallel to each other (the first resistance value R1) and the resistance value in a case in which the magnetization M1 and the magnetization M2 are antiparallel to each other.

In the case shown in FIG. 4, a spin transfer torque in the same direction as the magnetization M2 of the second ferromagnetic layer 2 acts on the magnetization M1 of the first ferromagnetic layer 1. Therefore, the magnetization M1 tries to return to the parallel state with the magnetization M2, and when the intensity of the light applied to the first ferromagnetic layer 1 changes from the second intensity to the first intensity, the magnetic element 10 returns to the initial state. In the case shown in FIG. 5, when the intensity of the light applied to the first ferromagnetic layer 1 returns to the first intensity, the magnitude of the magnetization M1 of the first ferromagnetic layer 1 returns to the original magnitude, and the magnetic element 10 returns to the initial state. In either case, the resistance value of the magnetic element 10 in the z direction returns to the first resistance value R1. That is, when the intensity of the light applied to the first ferromagnetic layer 1 changes from the second intensity to the first intensity, the resistance value of the light detection element 100 in the z direction changes from the second resistance value R2 to the first resistance value R1, and the magnitude of the output voltage from the magnetic element 10 changes from the second value to the first value.

The output voltage from the light detection element 100 changes in response to a change in the intensity of the light applied to the first ferromagnetic layer 1, and thus it is possible to convert the change in the intensity of the applied light into the change in the output voltage from the light detection element 100. That is, the light detection element 100 can convert the light into an electrical signal. For example, a case in which the output voltage from the light detection element 100 is equal to or higher than a threshold value is treated as a first signal (for example, "1"), and a case in which the output voltage is less than the threshold value is treated as a second signal (for example, "0").

Here, the case in which the magnetization M1 and the magnetization M2 are parallel to each other in the initial state has been described as an example, but the magnetization M1 and the magnetization M2 may be antiparallel to each other in the initial state. In this case, the resistance value of the magnetic element 10 in the z direction becomes smaller as the state of the magnetization M1 changes (for example, as the angle change from the initial state of the magnetization M1 becomes larger). When the initial state is the case where the magnetization M1 and the magnetization M2 are antiparallel to each other, the sense current Is may flow from the second ferromagnetic layer 2 toward the first ferromagnetic layer 1. By allowing the sense current Is to flow in this direction, a spin transfer torque in a direction opposite to the magnetization M2 of the second ferromagnetic layer 2 acts on the magnetization M1 of the first ferromagnetic layer 1, and the magnetization M1 and the magnetization M2 become antiparallel to each other in the initial state.

In the first operation example, the case in which the light applied to the first ferromagnetic layer 1 has two stages of the first intensity and the second intensity has been described as an example, but in a second operation example, a case in which the intensity of the light applied to the first ferromagnetic layer 1 changes in multiple stages or in an analog manner will be described.

Figure 6:
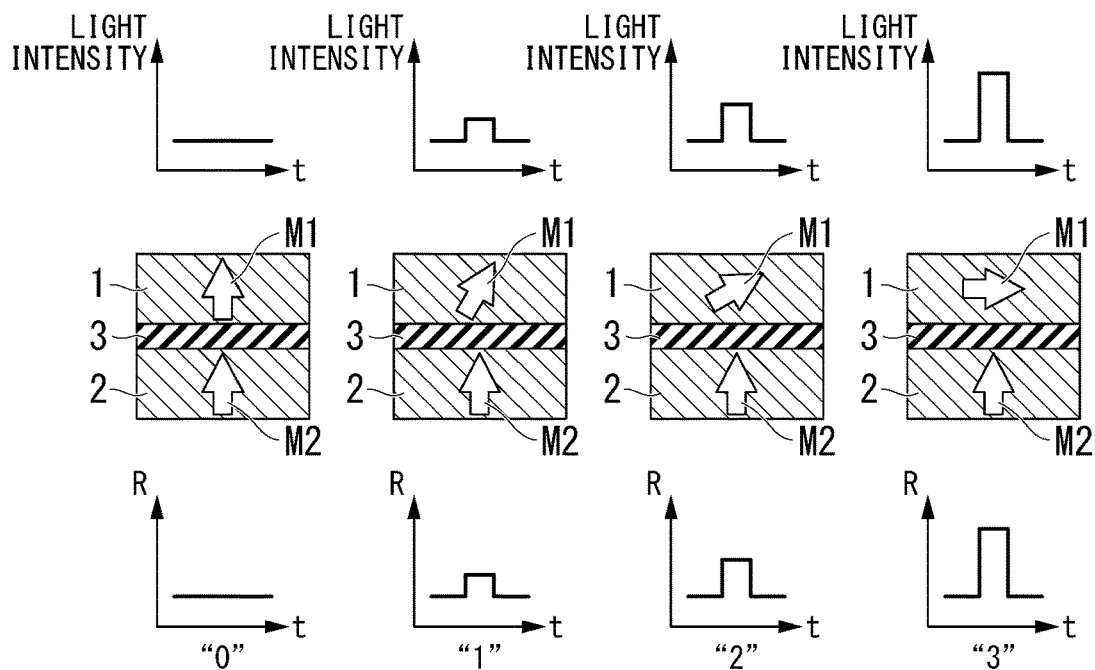
FIG. 6 is a diagram for explaining a first mechanism of a second operation example of the light detection element according to the first embodiment.
Figure 7:
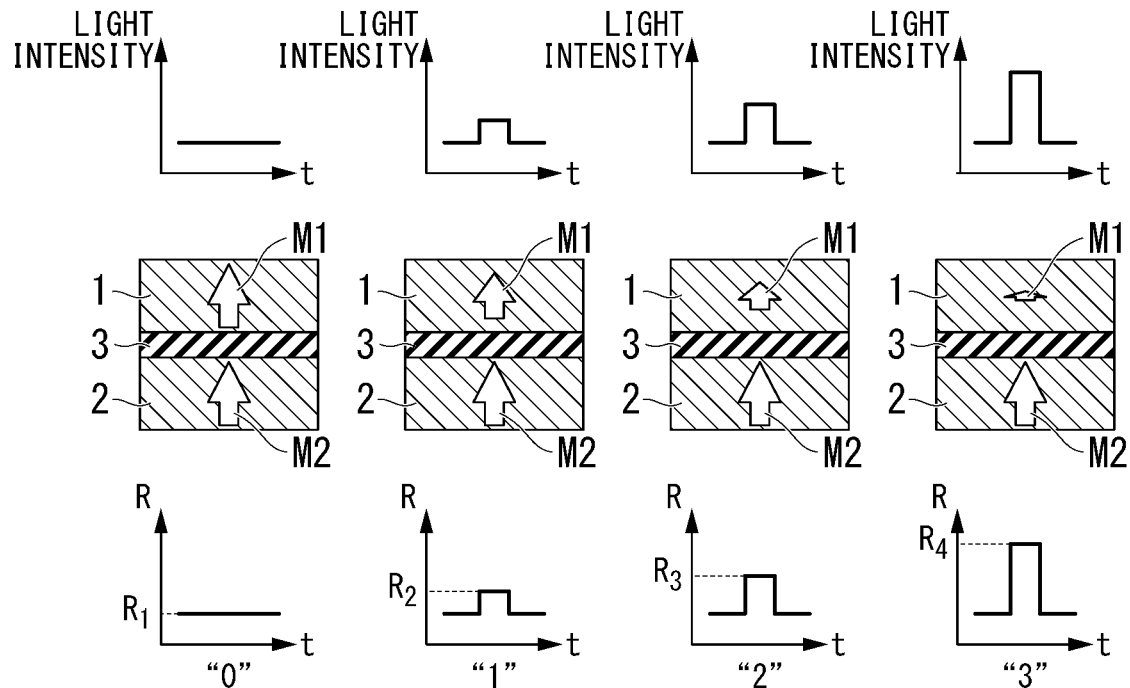
FIG. 7 is a diagram for explaining a second mechanism of the second operation example of the light detection element according to the first embodiment.

FIGS. 6 and 7 are diagrams for explaining the second operation example of the light detection element 100 according to the first embodiment. FIG. 6 is a diagram for explaining a first mechanism of the second operation example, and FIG. 7 is a diagram for explaining a second mechanism of the second operation example. In upper graphs of FIGS. 6 and 7, a vertical axis represents the intensity of the light applied to the first ferromagnetic layer 1, and a horizontal axis represents time. In lower graphs in FIGS. 6 and 7, a vertical axis represents a resistance value of the magnetic element 10 in the z direction, and a horizontal axis represents time.

In a case of FIG. 6, when the intensity of the light applied to the first ferromagnetic layer 1 becomes larger, the magnetization M1 of the first ferromagnetic layer 1 is tilted from the initial state due to the energy from the outside generated by the irradiation of the light. The angle between the direction of the magnetization M1 of the first ferromagnetic layer 1 in a state in which the first ferromagnetic layer 1 is not irradiated with light and the direction of the magnetization M1 in a state in which the first ferromagnetic layer 1 is irradiated with light is larger than 0° and less than 90°.

When the magnetization M1 of the first ferromagnetic layer 1 is tilted from the initial state, the resistance value of the magnetic element 10 in the z direction changes. Then, the output voltage from the magnetic element 10 changes. For example, the resistance value of the magnetic element 10 in the z direction changes to a second resistance value R2, a third resistance value R3, and the fourth resistance value R4, and the output voltage from the magnetic element 10 changes to a second value, a third value, and a fourth value according to the inclination of the magnetization M1 of the first ferromagnetic layer 1. The resistance value becomes larger in the order of the first resistance value R1, the second resistance value R2, the third resistance value R3, and the fourth resistance value R4. The output voltage from the magnetic element 10 becomes larger in the order of the first value, the second value, the third value, and the fourth value.

In the magnetic element 10, when the intensity of the light applied to the first ferromagnetic layer 1 changes, the output voltage from the magnetic element 10 (the resistance value of the magnetic element 10 in the z direction) changes. For example, when the first value (the first resistance value R1) is specified as "0," the second value (the second resistance value R2) is specified as "1," and the third value (the third resistance value R3) is specified as "2," and the fourth value (the fourth resistance value R4) is specified as "3," the light detection element 100 can output information of the four values. Here, a case in which four values is read out has been shown as an example, but the number of values to be read out can be freely designed by setting the threshold value of the output voltage (the resistance value of the magnetic element 10) from the magnetic element 10. Further, the light detection element 100 may output an analog value as it is.

Similarly, also in a case of FIG. 7, when the intensity of the light applied to the first ferromagnetic layer 1 becomes larger, the magnitude of the magnetization M1 of the first ferromagnetic layer 1 becomes smaller from the initial state due to the energy from the outside generated by the irradiation of the light. When the magnetization M1 of the first ferromagnetic layer 1 becomes smaller from the initial state, the resistance value of the magnetic element 10 in the z direction changes. Then, the output voltage from the magnetic element 10 changes. For example, the resistance value of the magnetic element 10 in the z direction changes to a second resistance value R2, a third resistance value R3, and the fourth resistance value R4, and the output voltage from the magnetic element 10 changes to a second value, a third value, and a fourth value according to the magnitude of the magnetization M1 of the first ferromagnetic layer 1. Therefore, as in the case of FIG. 6, the light detection element 100 can output a difference in the output voltages (the resistance values) as multi-valued or analog data.

Further, also in a case the second operation example, as in the case of the first operation example, when the intensity of the light applied to the first ferromagnetic layer 1 returns to the first intensity, the state of the magnetization M1 of the first ferromagnetic layer 1 returns to the original state, and the magnetic element 10 returns to the initial state.

Here, the case in which the magnetization M1 and magnetization M2 are parallel to each other in the initial state has been described as an example, but also in the second operation example, the magnetization M1 and the magnetization M2 may be antiparallel to each other in the initial state.

Further, in the first operation example and the second operation example, the case in which the magnetization M1 and the magnetization M2 are parallel or antiparallel to each other in the initial state has been illustrated, but the magnetization M1 and the magnetization M2 may be orthogonal to each other in the initial state. For example, a case in which the first ferromagnetic layer 1 is the in-plane magnetization film in which the magnetization M1 is oriented in any direction of the xy plane and the second ferromagnetic layer 2 is the vertical magnetization film in which the magnetization M2 is oriented in the z direction corresponds to this case. The magnetization M1 is oriented in any direction in the xy plane due to the magnetic anisotropy, and the magnetization M2 is oriented in the z direction, and thus the magnetization M1 and the magnetization M2 are orthogonal to each other in the initial state.

Figure 8:
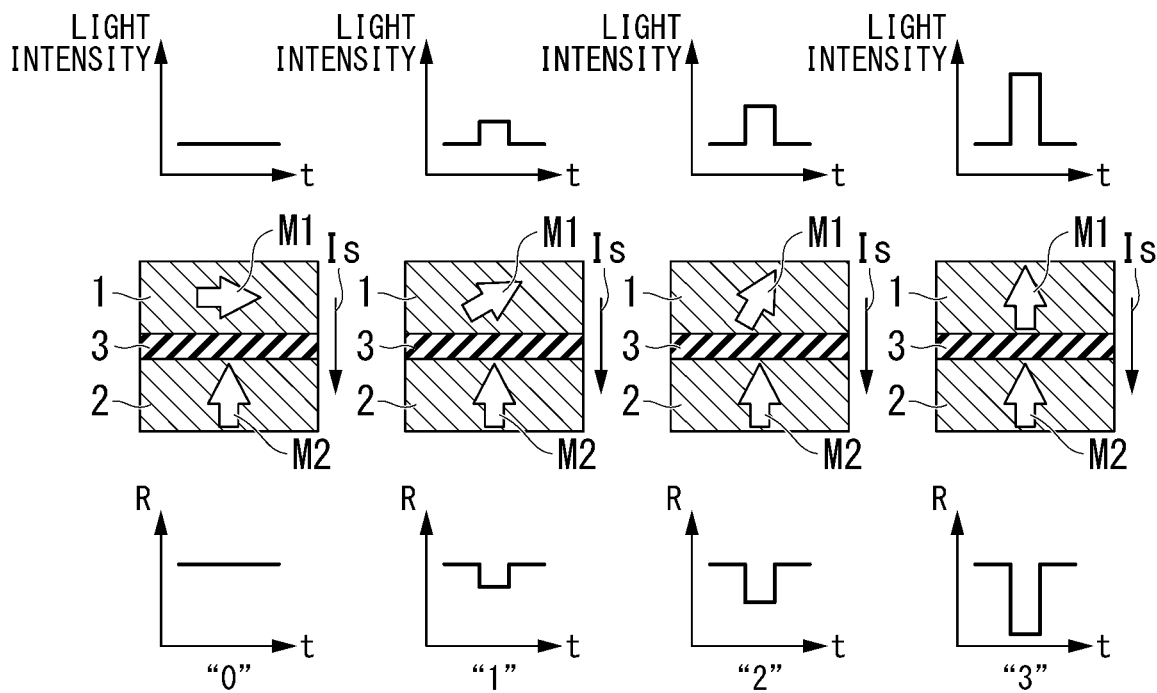
FIG. 8 is a diagram for explaining another example of the second operation example of the light detection element according to the first embodiment.
Figure 9:
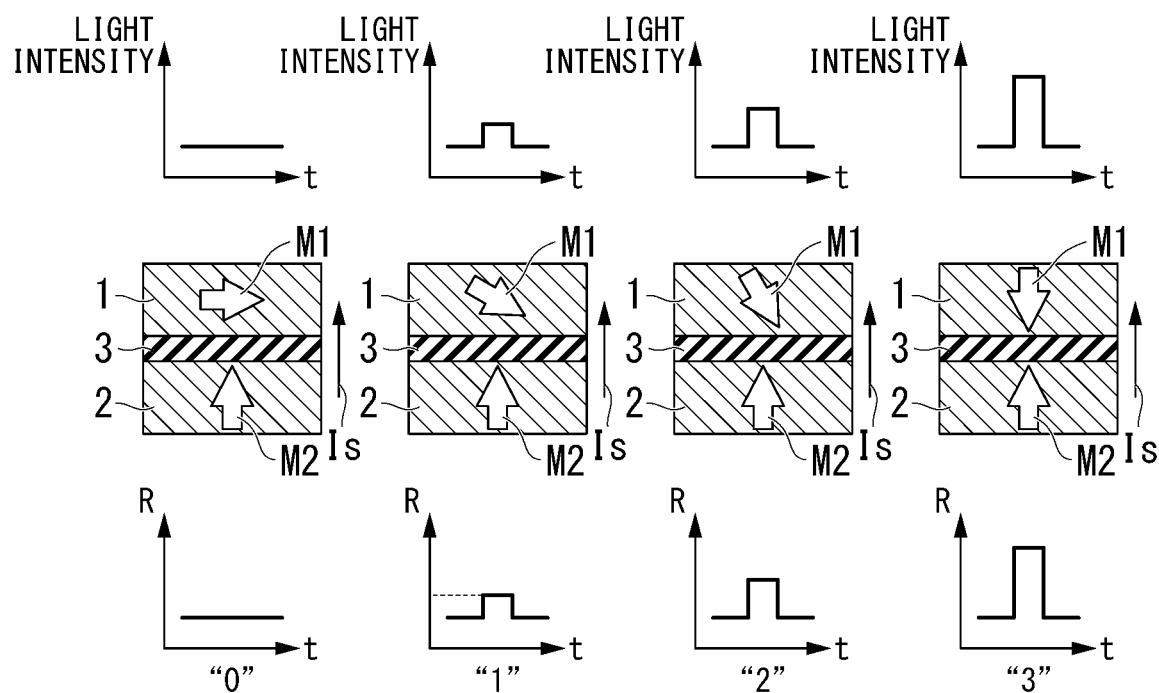
FIG. 9 is a diagram for explaining still another example of the second operation example of the light detection element according to the first embodiment.

FIGS. 8 and 9 are diagrams for explaining other examples of the second operation example of the light detection element 100 according to the first embodiment. The flow direction of the sense current Is applied to the magnetic element 10 is different between FIGS. 8 and 9. In FIG. 8, the sense current Is is allowed to flow from the first ferromagnetic layer 1 toward the second ferromagnetic layer 2. In FIG. 9, the sense current Is is allowed to flow from the second ferromagnetic layer 2 toward the first ferromagnetic layer 1.

In any case of FIGS. 8 and 9, the sense current Is flows through the magnetic element 10, and thus a spin transfer torque acts on the magnetization M1 in the initial state. In the case of FIG. 8, the spin transfer torque acts such that the magnetization M1 is parallel to the magnetization M2 of the second ferromagnetic layer 2. In the case of FIG. 9, the spin transfer torque acts such that the magnetization M1 is antiparallel to the magnetization M2 of the second ferromagnetic layer 2. In any case of FIGS. 8 and 9, in the initial state, the effect of the magnetic anisotropy on the magnetization M1 is larger than the effect of the spin transfer torque on the magnetization M1, and thus the magnetization M1 is oriented in any direction in the xy plane.

When the intensity of the light applied to the first ferromagnetic layer 1 becomes larger, the magnetization M1 of the first ferromagnetic layer 1 is tilted from the initial state due to the energy from the outside generated by the irradiation of the light. This is because the sum of the effect due to the irradiation of light applied to the magnetization M1 and the effect due to the spin transfer torque becomes larger than the effect due to the magnetic anisotropy related to the magnetization M1. When the intensity of the light applied to the first ferromagnetic layer 1 becomes larger, the magnetization M1 in the case of FIG. 8 is tilted to be parallel to the magnetization M2 of the second ferromagnetic layer 2, and the magnetization M1 in the case of FIG. 9 is tilted to be antiparallel to the magnetization M2 of the second ferromagnetic layer 2. Since the directions of the spin transfer torque acting on the magnetization M1 are different, the inclination directions of the magnetization M1 in FIGS. 8 and 9 are different.

When the intensity of the light applied to the first ferromagnetic layer 1 becomes larger, the resistance value of the magnetic element 10 becomes smaller, and the output voltage from the magnetic element 10 becomes smaller in the case of FIG. 8. In the case of FIG. 9, the resistance value of the magnetic element 10 becomes larger, and the output voltage from the magnetic element 10 becomes larger.

When the intensity of the light applied to the first ferromagnetic layer 1 returns to the first intensity, the state of the magnetization M1 of the first ferromagnetic layer 1 returns to the original state due to the effect of the magnetic anisotropy on the magnetization M1. As a result, the magnetic element 10 returns to the initial state.

Here, the example in which the first ferromagnetic layer 1 is an in-plane magnetization film and the second ferromagnetic layer 2 is a vertical magnetization film has been described, but the relationship may be reversed. That is, in the initial state, the magnetization M1 may be oriented in the z direction, and the magnetization M2 may be oriented in any direction in the xy plane.

As described above, the light detection element 100 according to the first embodiment can convert light into an electrical signal by converting the light applied to the magnetic element 10 into the output voltage from the magnetic element 10.

Further, the magnetic element 10 is irradiated with light L from a side of the side surface 10s. That is, the light L is likely to be applied to a portion of the first ferromagnetic layer 1 on a side of the spacer layer 3. The change in the magnetization state of the portion of the first ferromagnetic layer 1 on a side of the spacer layer 3 greatly contributes to the change in the output voltage from the magnetic element 10 (the change in the resistance value of the magnetic element 10 in the z direction). As a result, the responsiveness of the output voltage change (the change in the resistance value of the magnetic element 10) from the magnetic element 10 with respect to the change in the state of the light L is high.

Although the first embodiment has been described in detail with reference to the drawings, the first embodiment is not limited to this example.

Figure 10:
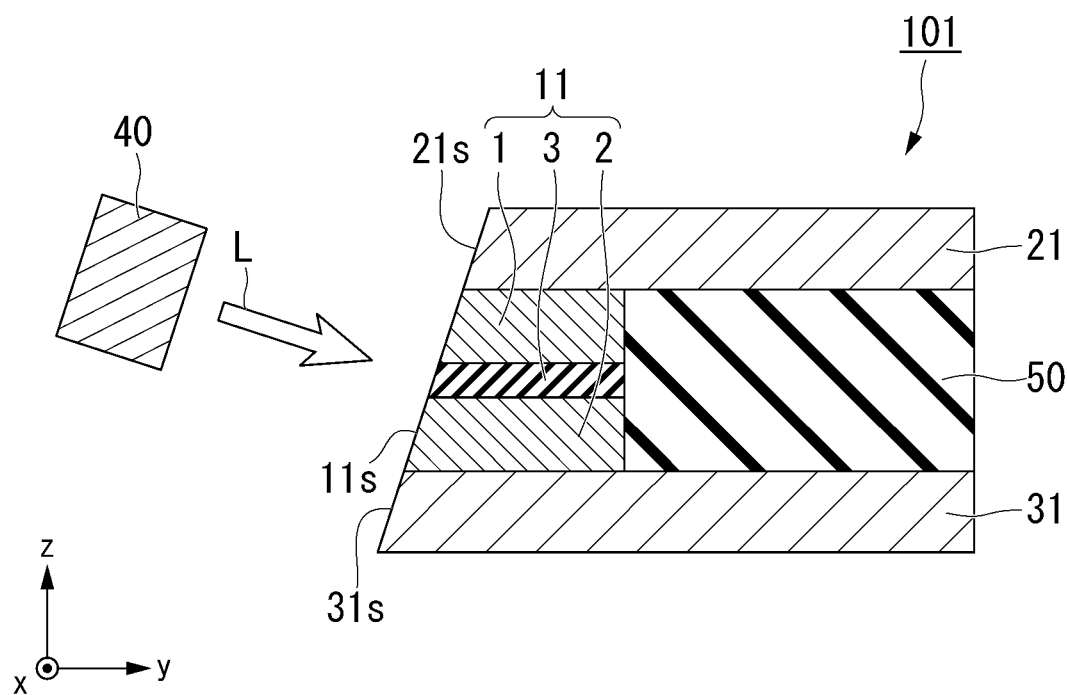
FIG. 10 is a cross-sectional view of a light detection element according to a first modification example.

For example, as in the light detection element 101 shown in FIG. 10, a side surface 11s of a magnetic element 11 may be inclined with respect to the z direction. The side surface 11s is continuous with a side surface 21s of a first electrode 21 and a side surface 31s of a second electrode 31. The side surface 11s is a flat surface. The light detection element 101 according to a first modification example has the same effect as the light detection element 100 because a portion of the first ferromagnetic layer 1 on a side of the spacer layer is also easily irradiated with light.

Figure 11:
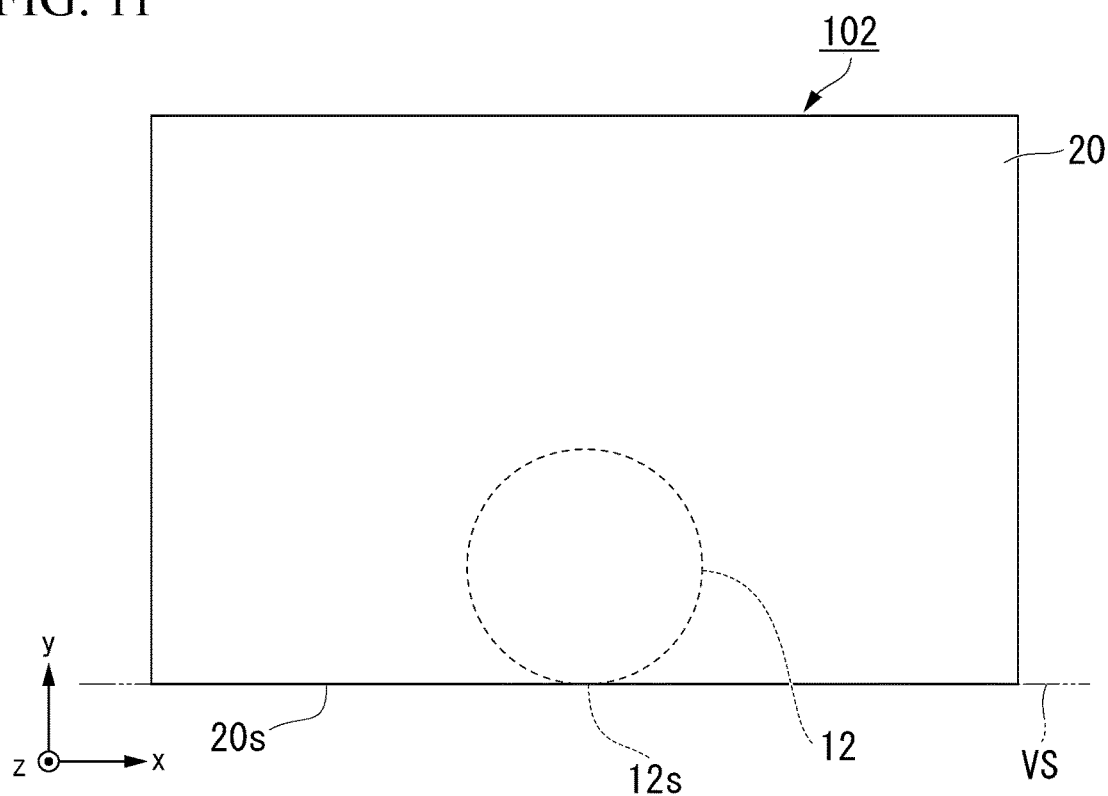
FIG. 11 is a plan view of a light detection element according to a second modification example.
Figure 12:
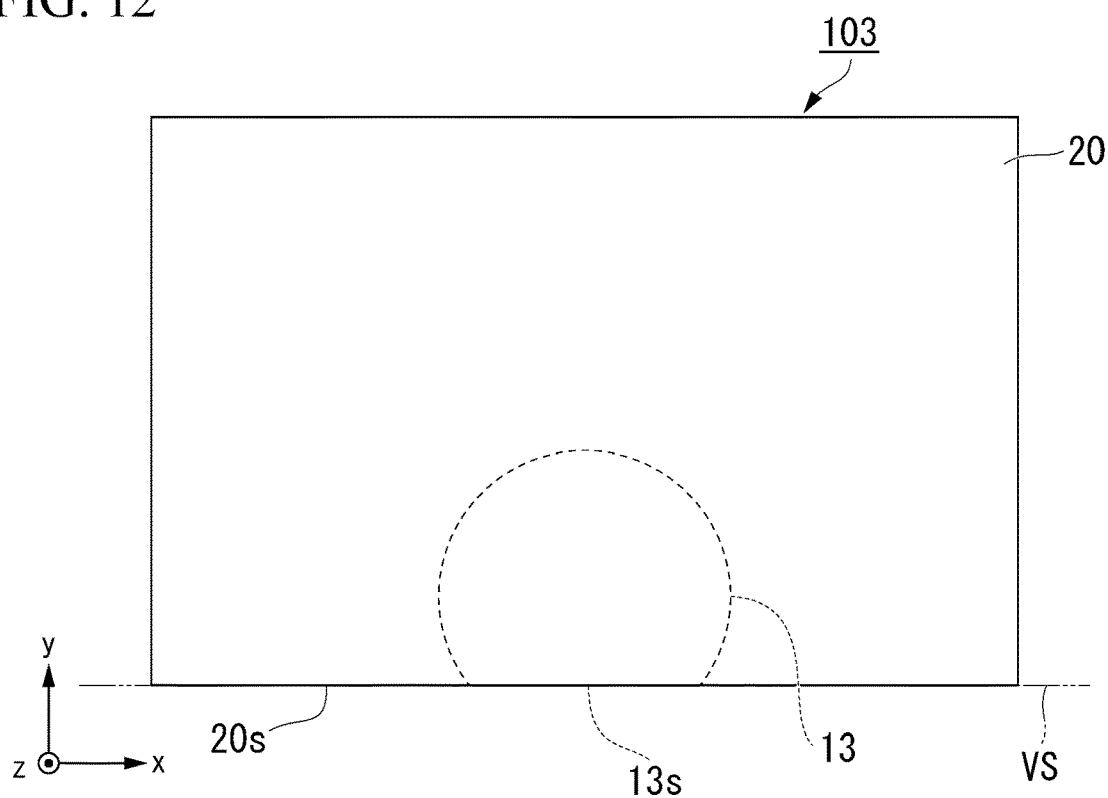
FIG. 12 is a plan view of a light detection element according to a third modification example.

Further, like a light detection element 102 shown in FIG. 11 and a light detection element 103 shown in FIG. 12, the shapes of magnetic elements 12 and 13 when seen in the z direction may be other than rectangular.

The magnetic element 12 shown in FIG. 11 has a circular shape when seen in the z direction. A part of a side surface 12s of the magnetic element 12, the side surface 20s of the first electrode 20, and the side surface 30s of the second electrode 30 are in contact with the same virtual plane VS. The side surface 12s is in contact with the virtual plane VS at a linear portion extending in the z direction. The portion of the side surface 12s in contact with the virtual plane VS, the side surface 20s, and the side surface 30s are continuous.

The magnetic element 13 shown in FIG. 12 is a partial circle in which a part of a circle is lacking when seen in the z direction. A side surface of the magnetic element 13 includes a side surface 13s which is a flat surface and an arcuate side surface when seen in the z direction. The side surface 13s, the side surface 20s, and the side surface 30s are in contact with the same virtual plane VS. The side surface 13s, the side surface 20s, and the side surface 30s are continuous.

Figure 13:
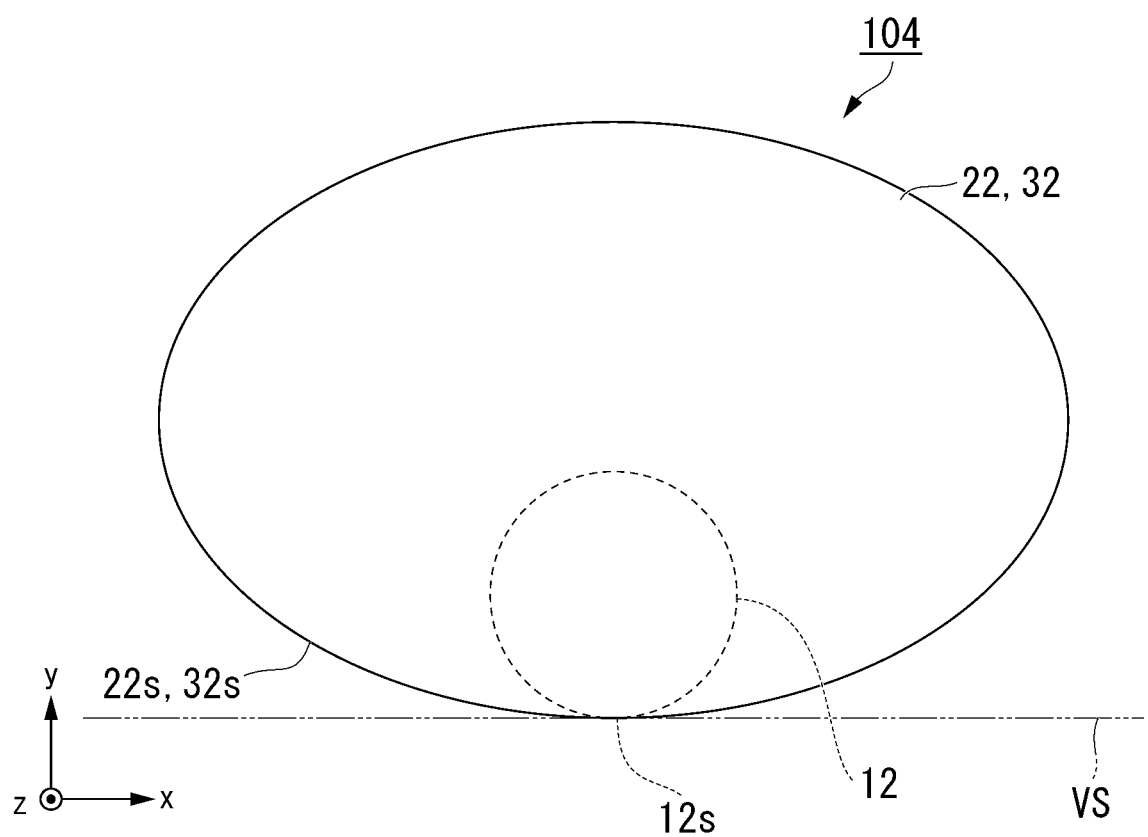
FIG. 13 is a plan view of a light detection element according to a fourth modification example.

Further, like a light detection element 104 shown in FIG. 13, the shapes of a first electrode 22 and a second electrode 32 when seen in the z direction may be other than rectangular.

A magnetic element 12 shown in FIG. 13 has a circular shape when seen in the z direction. Further, a first electrode 22 and a second electrode 32 shown in FIG. 13 each have an elliptical shape when seen in the z direction. A part of a side surface 12s of the magnetic element 12, a part of a side surface 22s of the first electrode 22, and a part of a side surface 32s of the second electrode 32 are in contact with the same virtual plane VS. The side surface 12s is in contact with the virtual plane VS at a linear portion extending in the z direction. The side surface 22s is in contact with the virtual plane VS at a linear portion extending in the z direction. The side surface 32s is in contact with the virtual plane VS at a linear portion extending in the z direction. The portion of the side surface 12s in contact with the virtual plane VS and the portions of the side surface 22s and 32s in contact with the virtual plane VS are continuous.

Further, in the above, an example in which a part of the side surfaces of both the first electrode and the second electrode and a part of the side surface of the magnetic element are in contact with the same virtual plane VS has been shown and described, but the present disclosure is not limited to only this case. For example, only a part of the side surface of one of the first electrode and the second electrode and a part of the side surface of the magnetic element may be in contact with the same virtual plane VS.

Second Embodiment

Figure 14:
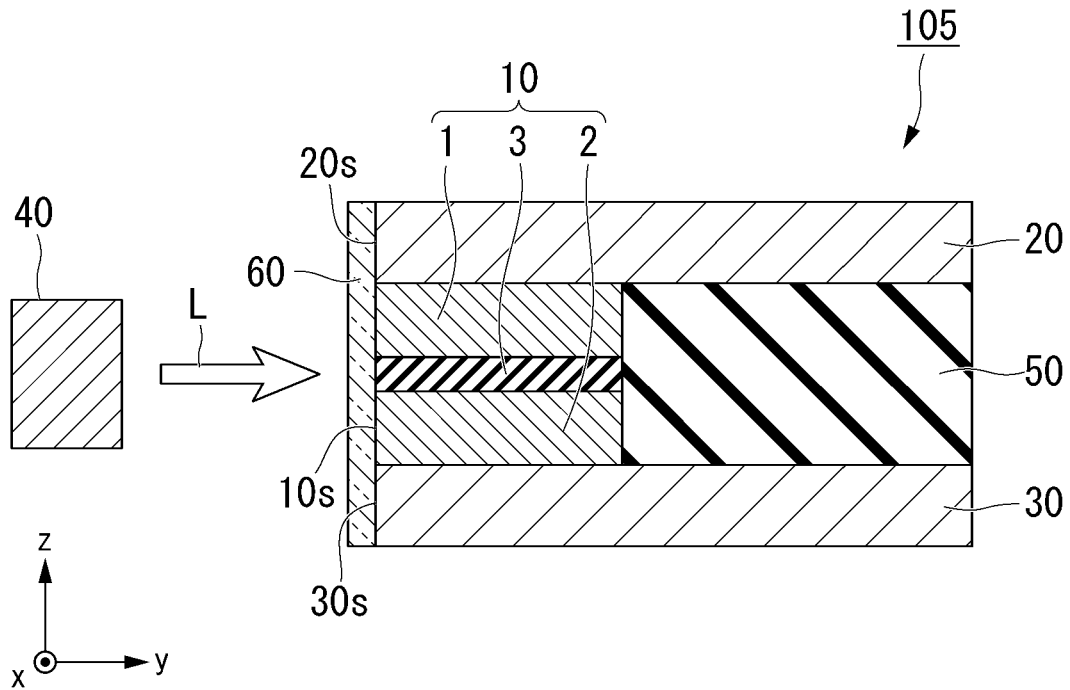
FIG. 14 is a cross-sectional view of a light detection element according to a second embodiment.

FIG. 14 is a yz cross-sectional view of a light detection element 105 according to a second embodiment. The light detection element 105 is different from the light detection element 100 according to the first embodiment in that it has an oxide film 60. In the second embodiment, the same configurations as those in the first embodiment are designated by the same reference numerals, and the description thereof will be omitted.

The oxide film 60 covers a flat surface including the side surface 10s, the side surface 20s, and the side surface 30s. In FIG. 14, an example in which the entire surface of the flat surface including the side surface 10s, the side surface 20s, and the side surface 30s is covered with the oxide film 60 has been shown, but a configuration in which only a part thereof is covered may be used. For example, the oxide film 60 may be configured to cover only the side surface 10s of the magnetic element 10.

The oxide film 60 has transparency in the wavelength range of the light applied to the magnetic element 10. The oxide film 60 is, for example, an oxide having an insulating property. The oxide film 60 is, for example, silicon oxide, aluminum oxide, or the like. The oxide film 60 protects the side surface 10s of the magnetic element 10 from corrosion, wear, and the like.

The light detection element 105 according to the second embodiment has the same effect as the light detection element 100. Further, due to the oxide film 60, the light detection element 105 has excellent weather resistance.

Third Embodiment

Figure 15:
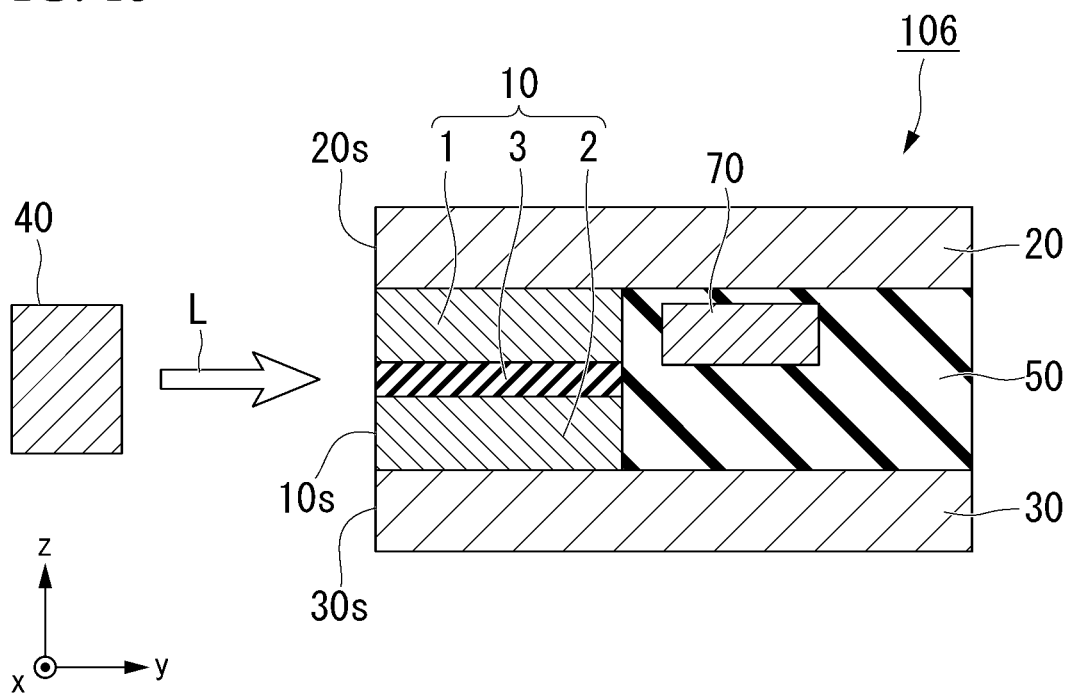
FIG. 15 is a cross-sectional view of a light detection element according to a third embodiment.

FIG. 15 is a yz cross-sectional view of a light detection element 106 according to a third embodiment. The light detection element 106 is different from the light detection element 100 according to the first embodiment in that it has a heat generating part 70. In the third embodiment, the same configurations as those in the first embodiment are designated by the same reference numerals, and the description thereof will be omitted.

The heat generating part 70 is in a position at which the heat generating part 70 is able to heat the first ferromagnetic layer 1. The heat generating part 70 is, for example, behind the magnetic element 10 in the light irradiation direction with respect to the magnetic element 10. The heat generating part 70 does not have to overlap the magnetic element 10 when seen in the light irradiation direction. The heat generating part 70 is on a side opposite to a surface of the magnetic element 10 on which the light L is mainly applied with the magnetic element 10 interposed therebetween.

The heat generating part 70 is, for example, a coil. The heat generating part 70 is a resistor made of, for example, Cu, a nickel-chromium alloy, an iron-chromium-aluminum alloy, or the like. When a current flows through the resistor, the heat generating part 70 generates heat.

When the heat generating part 70 generates heat, the first ferromagnetic layer 1 is heated. The heated first ferromagnetic layer 1 expands. When the first ferromagnetic layer 1 expands, the side surface of the first ferromagnetic layer 1 protrudes from a virtual surface connecting the side surface 20s and the side surface 30s.

The light detection element 106 according to the third embodiment has the same effect as the light detection element 100. Further, the side surface of the first ferromagnetic layer 1 can be protruded from the virtual surface connecting the side surface 20s and the side surface 30s with the heat generated by the heat generating part 70, and thus a distance between the side surface of the first ferromagnetic layer 1 and the light irradiation part 40 can be changed. As a result, it is possible to adjust the intensity of the light applied to the first ferromagnetic layer 1 without changing the irradiation intensity from the light irradiation part 40.

Fourth Embodiment

Figure 16:
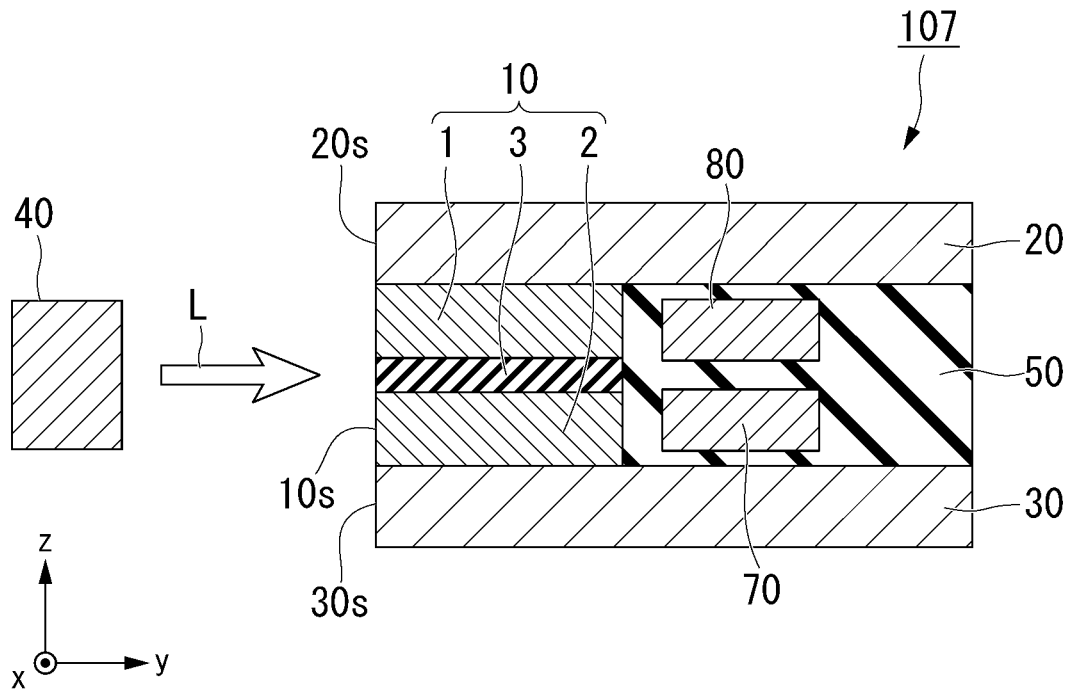
FIG. 16 is a cross-sectional view of a light detection element according to a fourth embodiment.

FIG. 16 is a yz cross-sectional view of a light detection element 107 according to a fourth embodiment. The light detection element 107 is different from the light detection element 100 according to the first embodiment in that it has the heat generating part 70 and an expansion part 80. In the third embodiment, the same configurations as those in the first embodiment are designated by the same reference numerals, and the description thereof will be omitted.

The heat generating part 70 is in a position at which the heat generating part is able to heat the expansion part 80. The heat generating part 70 is, for example, behind the magnetic element 10 in the light irradiation direction with respect to the magnetic element 10. The heat generating part 70 does not have to overlap the magnetic element 10 when seen in the light irradiation direction. The heat generating part 70 is on a side opposite to a surface of the magnetic element 10 on which the light L is mainly applied with the magnetic element 10 interposed therebetween.

The expansion part 80 is, for example, behind the magnetic element 10 in the light irradiation direction with respect to the magnetic element 10. The expansion part 80 does not have to overlap the magnetic element 10 when seen in the light irradiation direction. The expansion part 80 is on a side opposite to a surface of the magnetic element 10 on which the light L is mainly applied with the magnetic element 10 interposed therebetween. The expansion part 80 is heated and expands when the heat generating part 70 generates heat. The expansion part 80 is in a position at which the expansion part 80 is able to extrude the first ferromagnetic layer 1.

The expansion part 80 is made of a material having a coefficient of linear thermal expansion larger than that of the first ferromagnetic layer 1. The expansion part 80 is, for example, aluminum, magnesium, zinc, tin, or an alloy containing these.

When the heat generating part 70 generates heat, the expansion part 80 is heated. When the heated expansion part 80 expands, the first ferromagnetic layer 1 is extruded outward. As a result, the side surface of the first ferromagnetic layer 1 protrudes from the virtual surface connecting the side surface 20s and the side surface 30s.

The light detection element 107 according to the fourth embodiment has the same effect as the light detection element 100. Further, the distance between the side surface of the first ferromagnetic layer 1 and the light irradiation part 40 can be changed with the heat generation of the heat generating part 70 and the expansion of the expansion part 80. As a result, it is possible to adjust the intensity of the light applied to the first ferromagnetic layer 1 without changing the irradiation intensity from the light irradiation part 40.

As described above, the present disclosure is not limited to the above-described embodiments and modification examples, and various modifications and changes can be made within the scope of the gist of the present disclosure described in the claims. For example, the characteristic configurations of the above-described embodiments and modification examples may be combined.

The light detection elements according to the above-described embodiments and modification examples can be applied to a light sensor device such as an image sensor, a transmitting and receiving device of a communication system, and the like.

Figure 17:
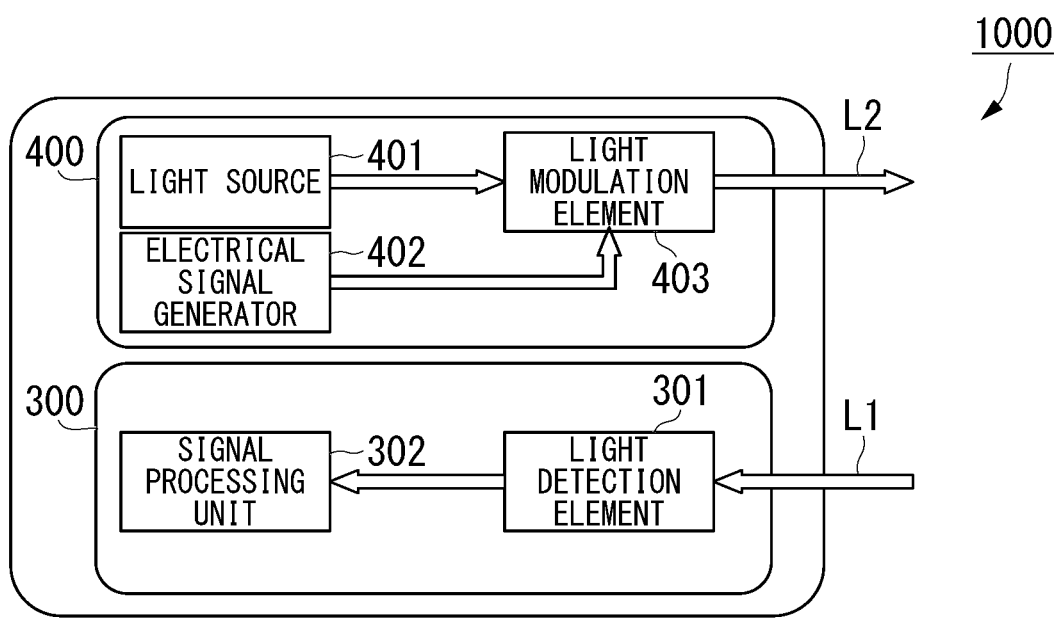
FIG. 17 is a block diagram of a transmitting and receiving device according to a first application example.

FIG. 17 is a block diagram of a transmitting and receiving device 1000 according to a first application example. The transmitting and receiving device 1000 includes a receiving device 300 and a transmitting device 400. The receiving device 300 receives a light signal L1, and the transmitting device 400 transmits a light signal L2.

The receiving device 300 includes, for example, a light detection element 301 and a signal processing unit 302. The light detection element 301 is any one of the light detection elements 100 to 107 according to the above-described embodiments or modification examples. In the receiving device 300, the first ferromagnetic layer 1 is irradiated with light that includes a high-frequency light signal L1 and changes in intensity. A lens may be disposed on a side of the first ferromagnetic layer 1 in the stacking direction of the light detection element 301 such that the light collected through the lens is applied to the first ferromagnetic layer 1. The lens may be formed in a wafer process of forming the light detection element 301. Further, the light that has passed through a waveguide may be applied to the first ferromagnetic layer 1 of the light detection element 301. The light applied to the first ferromagnetic layer 1 of the light detection element 301 is, for example, laser light. The light detection element 301 converts the light signal L1 into an electrical signal. The operation of the light detection element 301 may be either the first operation example or the second operation example. The signal processing unit 302 processes the electrical signal converted by the light detection element 301. The signal processing unit 302 receives a signal included in the light signal L1 by processing the electrical signal generated from the light detection element 301. The receiving device 300 receives the signal included in the light signal L1 on the basis of the output voltage from any one of the magnetic elements 10 to 13.

The transmitting device 400 includes, for example, a light source 401, an electrical signal generator 402, and a light modulation element 403. The light source 401 is, for example, a laser element. The light source 401 may be outside the transmitting device 400. The electrical signal generator 402 generates an electrical signal on the basis of transmission information. The electrical signal generator 402 may be integrated with a signal conversion element of the signal processing unit 302. The light modulation element 403 modulates the light output from the light source 401 on the basis of the electrical signal generated by the electrical signal generator 402 and outputs the light signal L2.

Figure 18:
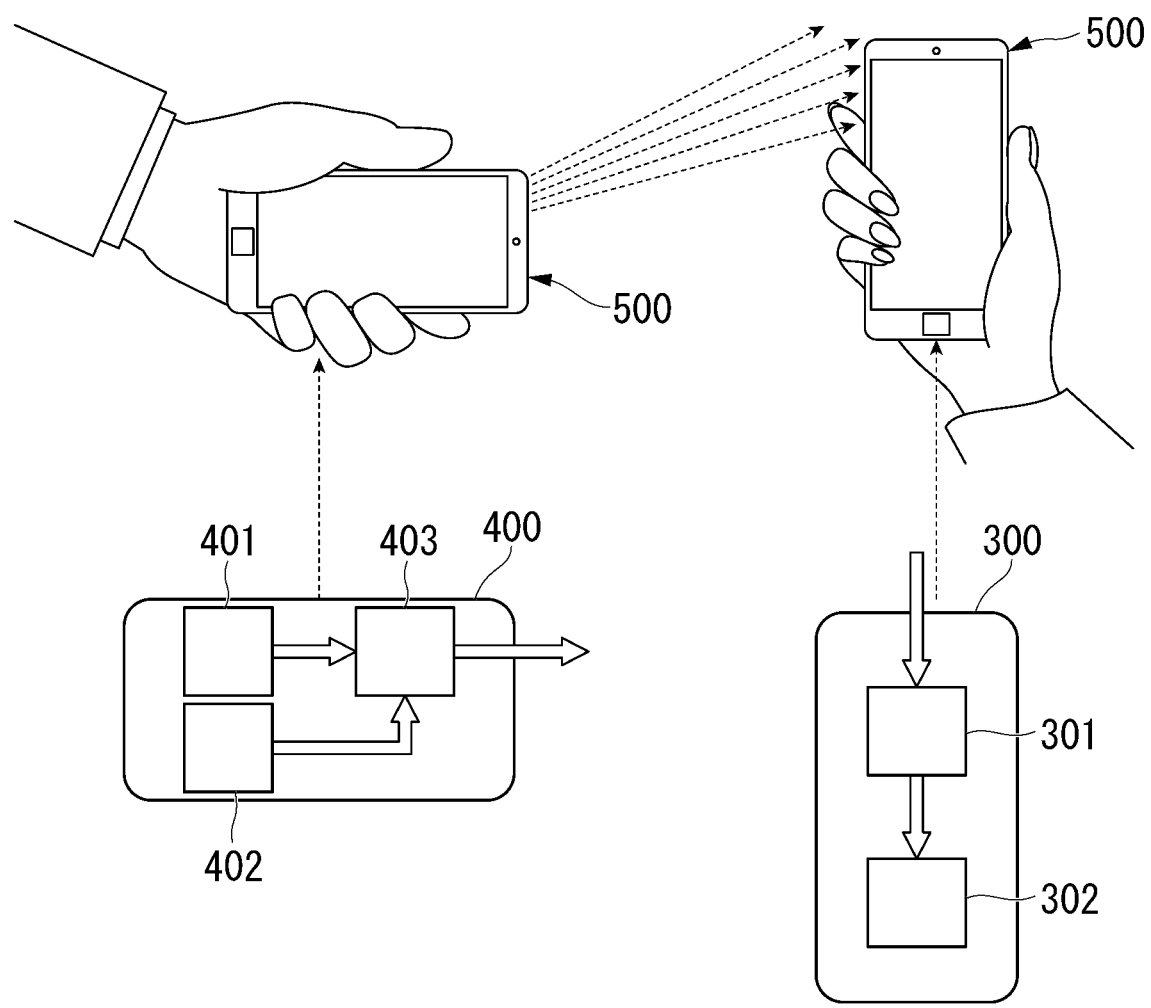
FIG. 18 is a conceptual diagram of an example of a communication system.

FIG. 18 is a conceptual diagram of an example of a communication system. The communication system shown in FIG. 18 has two terminal devices 500. The terminal device 500 is, for example, a smartphone, a tablet, a personal computer, or the like.

Each of the terminal devices 500 includes the receiving device 300 and the transmitting device 400. The light signal transmitted from the transmitting device 400 of one terminal device 500 is received by the receiving device 300 of the other terminal device 500. The light used for transmitting and receiving between the terminal devices 500 is, for example, visible light. The receiving device 300 has any one of the above-mentioned light detection elements 100 to 107 as the light detection element 301. Since the above-mentioned light detection elements 100 to 107 each have good responsiveness to light, the communication system shown in FIG. 18 is highly reliable.

Figure 19:
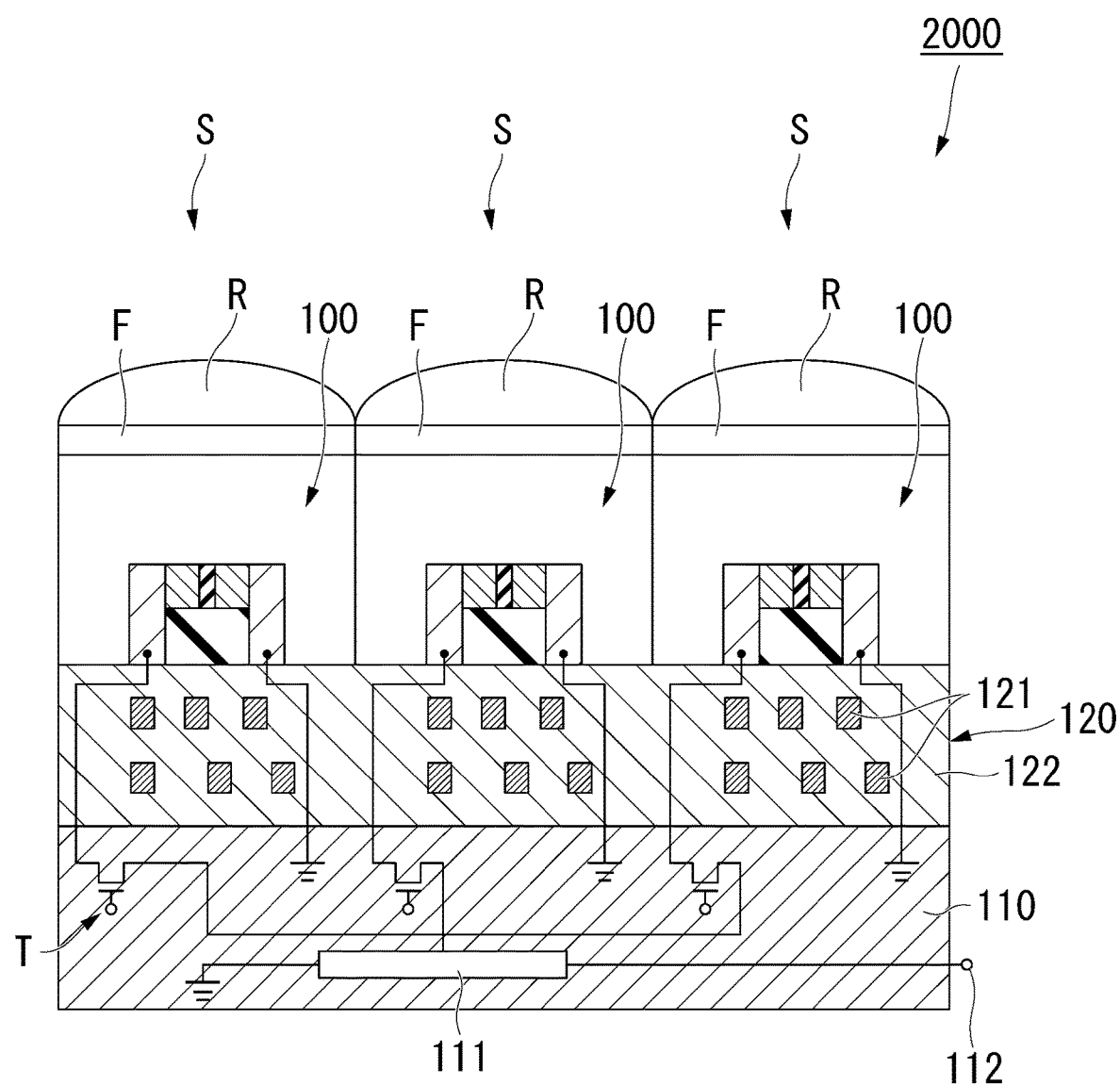
FIG. 19 is a conceptual diagram of a cross section of a light sensor device according to a second application example.

FIG. 19 is a conceptual diagram of a cross section of a light sensor device 2000 according to a second application example. The light sensor device 2000 has, for example, a circuit board 110, a wiring layer 120, and a plurality of light sensors S. The wiring layer 120 and each of the plurality of light sensors S are formed on the circuit board 110.

Each of the plurality of light sensors S has, for example, the light detection element 100, a wavelength filter F, and a lens R. In FIG. 19, an example in which the light detection element 100 is used has been shown, but any one of the light detection elements 101 to 107 may be used instead of the light detection element 100. The light detection element 100 is irradiated with light that is transmitted through the wavelength filter F. As described above, the light detection element 100 converts the light applied to the magnetic element 10 into the electrical signal. The light detection element 100 may operate in the second operation example.

The wavelength filter F selects light having a specific wavelength and transmits the light in a specific wavelength range. The wavelength range of the light transmitted through each wavelength filter F may be the same or different. For example, the light sensor device 2000 may have a light sensor S having a wavelength filter F that transmits blue (in a wavelength range of 380 nm or more and less than 490 nm) (hereinafter referred to as a blue sensor), a light sensor S having a wavelength filter F that transmits green (in a wavelength range of 490 nm or more and less than 590 nm) (hereinafter referred to as a green sensor), and a light sensor S having a wavelength filter F that transmits red (in a wavelength range of 590 nm or more and less than 800 nm) (hereinafter referred to as a red sensor). The blue sensor, the green sensor, and the red sensor are set as one pixel, and these pixels are arranged, and thus the light sensor device 2000 can be used as an image sensor.

The lens R collects light toward the magnetic element 10. In the light sensor S shown in FIG. 19, one light detection element 100 is disposed below one wavelength filter F, but a plurality of light detection elements 100 may be disposed below one wavelength filter F.

The circuit board 110 has, for example, an analog-digital converter 111 and an output terminal 112. The electrical signal sent from the light sensor S is converted into digital data by the analog-digital converter 111 and is output from the output terminal 112.

The wiring layer 120 has a plurality of wirings 121. An interlayer insulating film 122 is present between the plurality of wirings 121. The wiring 121 electrically connects each of the light sensors S and the circuit board 110 and electrically connects arithmetic circuits formed on the circuit board 110. Each of the light sensors S and the circuit board 110 are connected, for example, via a through wiring penetrating the interlayer insulating film 122 in the z direction. Noise can be reduced by shortening a distance between the wirings between each of the light sensors S and the circuit board 110.

The wiring 121 has conductivity. The wiring 121 is, for example, Al, Cu, or the like. The interlayer insulating film 122 is an insulator that insulates multilayer wirings and elements. The interlayer insulating film 122 is, for example, an oxide, a nitride, or an oxynitride of Si, Al, or Mg. The interlayer insulating film 122 is, for example, silicon oxide ($SiO_X$), silicon nitride ($SiN_X$), silicon carbide (SiC), chromium nitride, silicon carbonitride (SiCN), silicon oxynitride (SiON), aluminum oxide ($Al_2O_3$), and zirconium oxide ($ZrO_X$), or the like.

Figure 20:
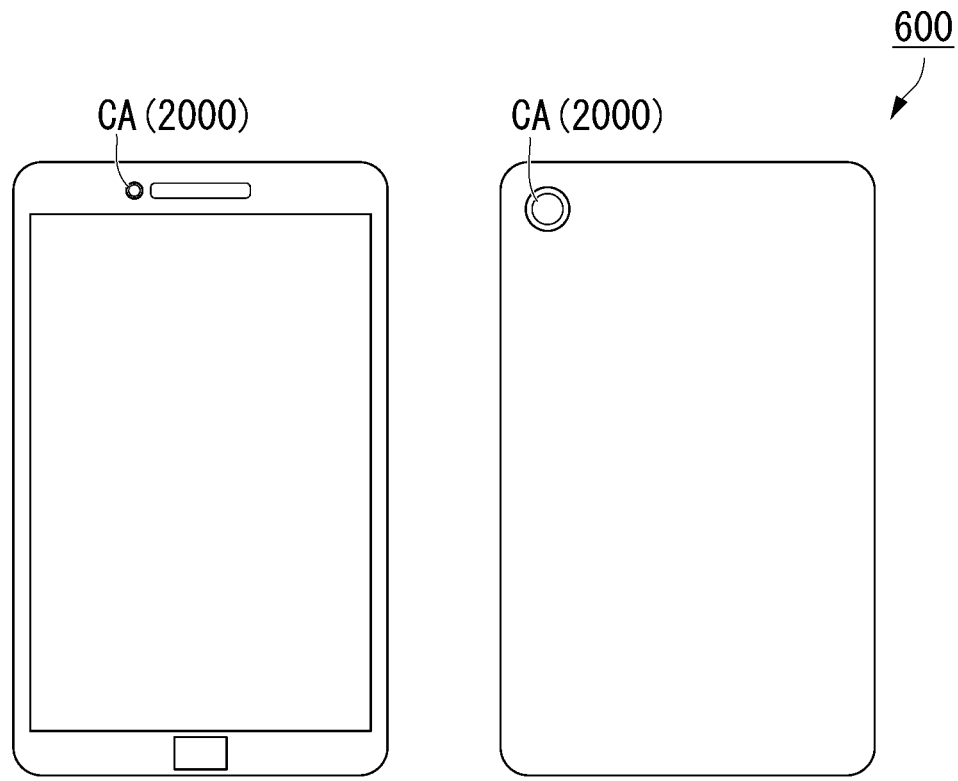
FIG. 20 is a schematic diagram of an example of a terminal device.

The above-mentioned light sensor device 2000 can be used, for example, in a terminal device. FIG. 20 is a schematic diagram of an example of a terminal device 600. A left side of FIG. 20 is a front surface of the terminal device 600, and a right side of FIG. 20 is a back surface of the terminal device 600. The terminal device 600 has a camera CA. The above-mentioned light sensor device 2000 can be used in an image pickup device of this camera CA. In FIG. 20, a smartphone is illustrated as an example of the terminal device 600, but the present invention is not limited to this case. The terminal device 600 is, for example, a tablet, a personal computer, a digital camera, or the like in addition to the smartphone.

While embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light detection element comprising:
    a magnetic element that includes a first ferromagnetic layer, a second ferromagnetic layer, and a spacer layer interposed between the first ferromagnetic layer and the second ferromagnetic layer stacked in a stacking direction,
    wherein the first ferromagnetic layer is configured to be irradiated with light in a direction intersecting the stacking direction, and
    the magnetic element is configured to detect the light.
2. The light detection element according to claim 1, further comprising:

a first electrode and a second electrode between which the magnetic element is interposed in the stacking direction, wherein a side surface of at least one of the first electrode and the second electrode and a side surface of the magnetic element are in contact with the same virtual plane at least in part, and the first ferromagnetic layer is configured to be irradiated with the light from a side of the virtual plane.

3. The light detection element according to claim 1, wherein a part of a side surface of the magnetic element is a flat surface, and the flat surface is configured to be irradiated with the light.

4. The light detection element according to claim 2, wherein a part of a side surface of the magnetic element is a flat surface, and the flat surface is configured to be irradiated with the light.

5. The light detection element according to claim 2, wherein a part of a side surface of the magnetic element is a flat surface, and the flat surface is in contact with the virtual plane.

6. The light detection element according to claim 3, further comprising an oxide film that covers the flat surface and is capable of transmitting the light.

7. The light detection element according to claim 4, further comprising an oxide film that covers the flat surface and is capable of transmitting the light.

8. The light detection element according to claim 5, further comprising an oxide film that covers the flat surface and is capable of transmitting the light.

9. The light detection element according to claim 1, further comprising:

a heat generating part, wherein the heat generating part is behind the magnetic element in a light irradiation direction in which the light is mainly applied to the magnetic element.

10. The light detection element according to claim 9, further comprising:

an expansion part, wherein the heat generating part is in a position at which the heat generating part is able to heat the expansion part, the expansion part is behind the magnetic element in a light irradiation direction in which the light is mainly applied to the magnetic element, and the expansion part has a coefficient of linear thermal expansion larger than that of the first ferromagnetic layer.

11. The light detection element according to claim 1, wherein the light is light that includes a high-frequency light signal and changes in intensity.

12. The light detection element according to claim 1, wherein the light is light that is transmitted through a wavelength filter.

13. A receiving device comprising the light detection element according to claim 1.

14. A light sensor device comprising the light detection element according to claim 1.

* * * * *